US005959930A

United States Patent [19]
Sakurai

[11] Patent Number: 5,959,930
[45] Date of Patent: Sep. 28, 1999

[54] MULTI-BANK SYNCHRONOUS SEMICONDUCTOR MEMORY DEVICE

[75] Inventor: Mikio Sakurai, Hyogo, Japan

[73] Assignee: Mitsubishi Denki Kabushiki Kaisha, Tokyo, Japan

[21] Appl. No.: 09/030,001

[22] Filed: Feb. 25, 1998

[30] Foreign Application Priority Data

Aug. 22, 1997 [JP] Japan ..................................... 9-226612

[51] Int. Cl.[6] ......................................................... G11C 8/00
[52] U.S. Cl. ......................................................... 365/230.03
[58] Field of Search ........................ 365/230.03, 189.01, 365/185.11

[56] References Cited

U.S. PATENT DOCUMENTS 5,511,029  4/1996  Sawada et al. ..................... 365/230.03
5,587,950  12/1996  Sawada et al. ..................... 365/230.03

FOREIGN PATENT DOCUMENTS 8-36883  2/1996  Japan .

Primary Examiner—David Nelms
Assistant Examiner—Anh Phung
Attorney, Agent, or Firm—McDermott, Will & Emery

[57] ABSTRACT

A plurality of memory banks are activated to select a memory cell in response to a bank select signal from a bank select signal generating circuit. When a special mode of operation is designated, a mode setting circuit activates all of bank select signals from the bank select signal generating circuit to simultaneously drive all memory banks to active/inactive state. Thus, a multi-bank, a synchronous semiconductor memory device capable of accessing memory cells at high speed and efficiently selecting memory cells is obtained.

12 Claims, 27 Drawing Sheets

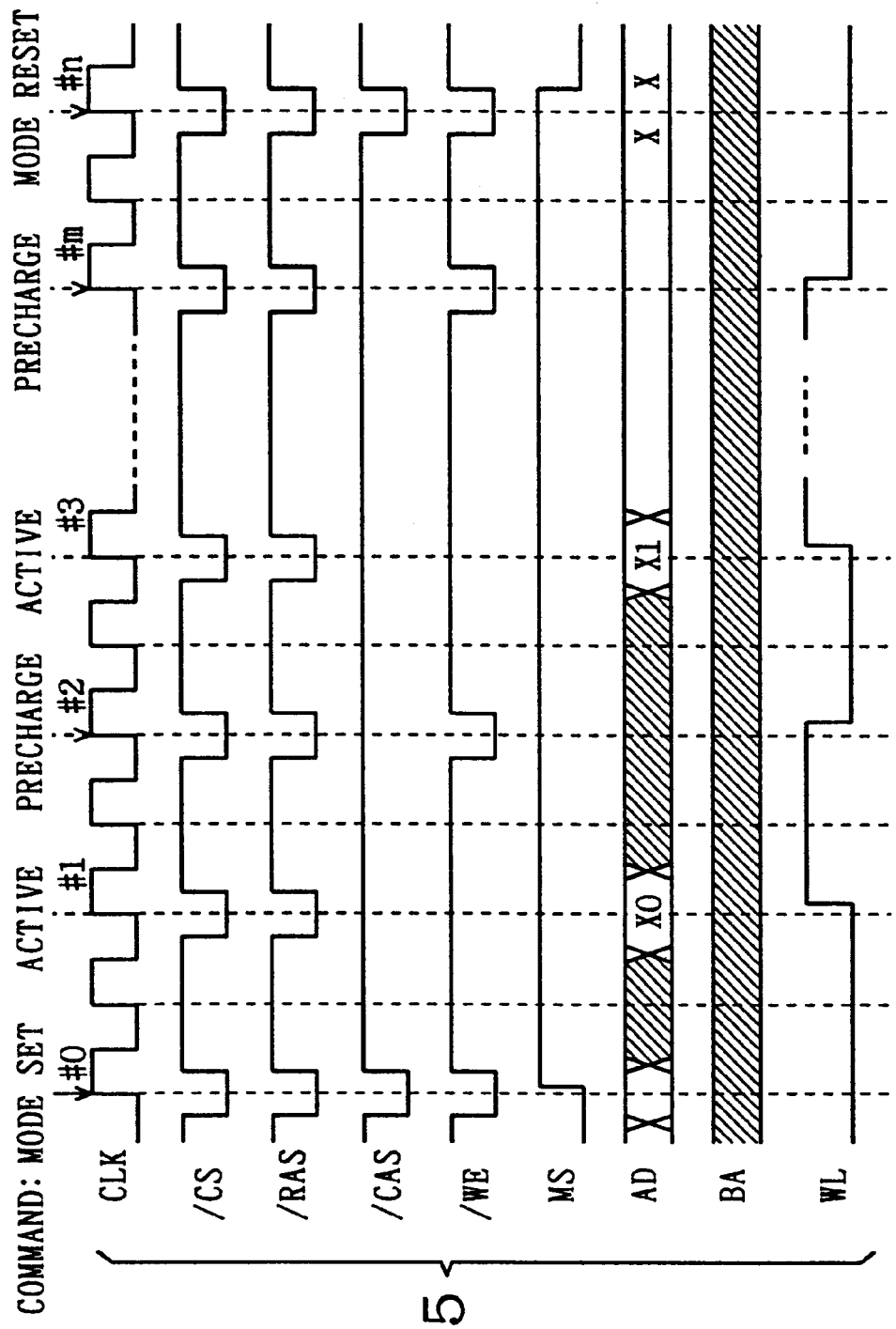
F I G. 15

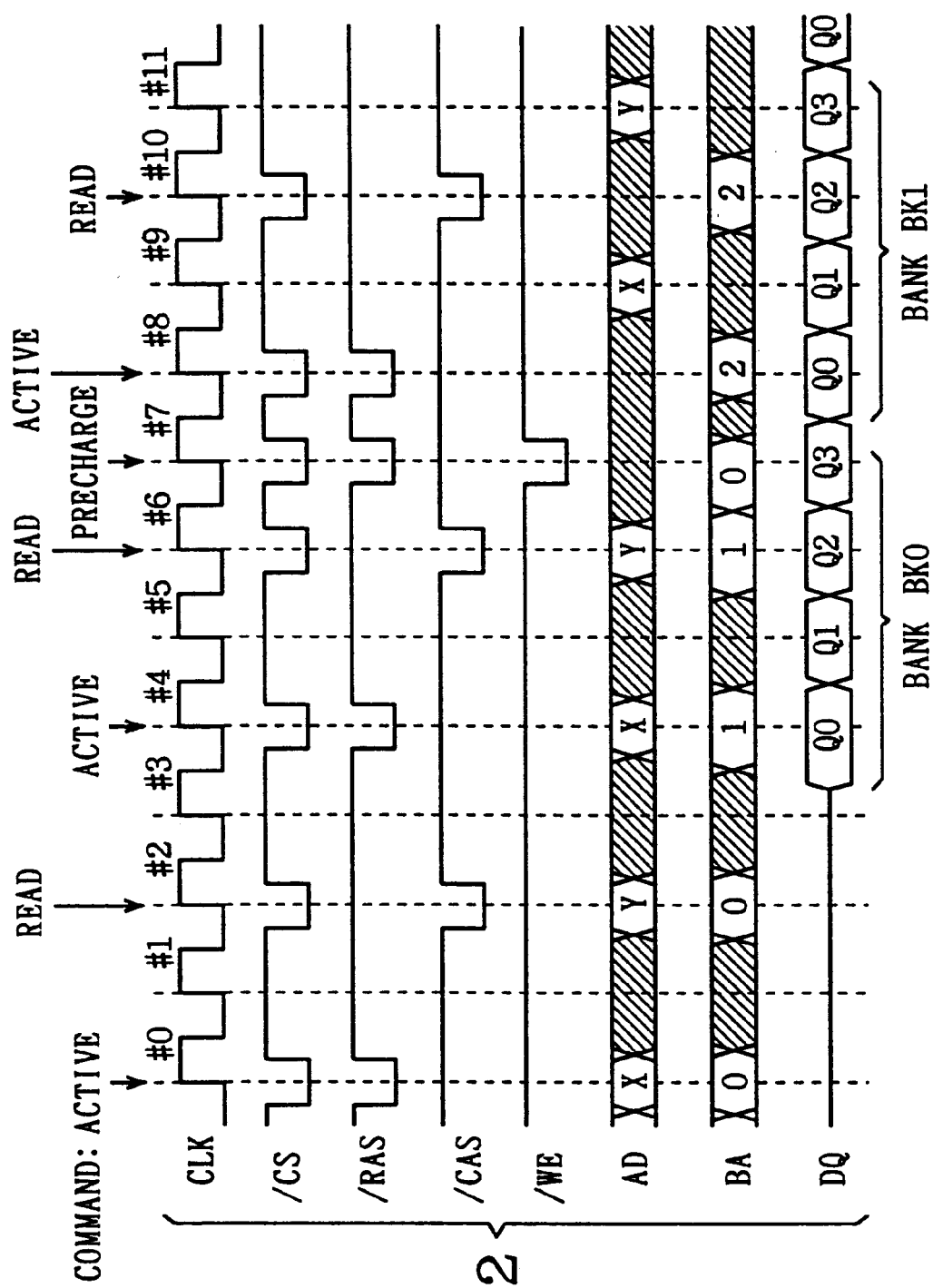
F I G. 4 2 PRIOR ART

ALL-BANK PRECHARGE

MULTI-BANK SYNCHRONOUS SEMICONDUCTOR MEMORY DEVICE

BACKGROUND OF THE INVENTION

1. Field of the Invention

The present invention relates to a semiconductor memory device, and in particular to a multi-bank semiconductor memory device with a plurality of banks. More specifically, the present invention relates to a multi-bank synchronous semiconductor memory device in which an instruction of a mode of operation is applied in the form of a command in synchronization with a clock signal.

2. Description of the Background Art

In recent years, synchronous semiconductor memory devices which input and output data in synchronization with an external clock signal such as a system clock have been more and more widely used to transmit data at high speed and reduce the difference between the processing speed of processor and that of memory.

FIG. 39 is a timing chart representing an operation in reading data of a conventional synchronous semiconductor memory device. Referring to FIG. 39, a data read operation in the conventional synchronous semiconductor memory device will now be described. In the synchronous semiconductor memory device, a mode of operation is instructed in the form of a command. A command is provided by a combination of the logic states of external control signals and in some modes an address signal bit at a rising edge or the like of a clock signal CLK.

In FIG. 39, at the rising edge of clock signal CLK in clock cycle #0, a chip select signal /CS and a row address strobe signal /RAS are each set to a low level and a column address strobe signal /CAS and a write enable signal /WE are each set to a high level. This combination of the states is referred to as "an active command" and designates activating an array. Activation of an array indicates the state in which a series of operations are completed from the selection of a word line in a memory cell array to the sensing, amplification and latching by sense amplifiers of the data of memory cells connected to the selected word line. When the active command is applied, a row select operation is internally performed using an address signal applied when the command is applied as a row address signal, the word line corresponding to the addressed row is selected and the data of a selected memory cell is sensed, amplified and latched.

When a so-called RAS-CAS delay time in a standard DRAM elapses, a column select operation is enabled. In FIG. 39, at the rising edge of clock signal CLK in clock cycle #2, chip select signal /CS and column address strobe signal /CAS are each set to a low level and row address strobe signal /RAS and write enable signal /WE are each set to a high level. This state is referred to as a read command and designates reading data. When the read command is applied, a column select operation is performed using an address signal AD applied when the command is applied as a column address signal Y to read the data of a memory cell on the selected column. Synchronous semiconductor memory devices have a period referred to as "CAS latency" which determines the period from application of a read command until valid data is defined. FIG. 39 shows an example with a CAS latency of 2. Thus, the first read data Q0 is defined at the rising edge of clock signal CLK in clock cycle #4.

Internally, an address generator referred to as a burst address counter uses the address applied when the read command is applied as the head address, to change a column address in a predetermined sequence for each cycle and a column select operation is performed. Thus, data Q1, Q2 and Q3 are output in clock cycles #5, #6 and #7. The number of data which can be successively read when one read command is applied is referred to as a burst length. FIG. 39 represents a data read operation for a burst length of four.

At the rising edge of clock signal CLK in clock cycle #7, chip select signal /CS, row address strobe signal /RAS and write enable signal /WE are each set to a low level and column address strobe signal /CAS is set to a high level. This state combination is referred to as a precharge command and the array is driven from an active state to an inactive state. Thus, a word line in a selected state is driven to a non-selected state, a sense amplifier which has latched the data of a memory cell is inactivated, and a bit line of each column is returned to a predetermined precharge potential.

The precharge command cannot be applied at a timing faster than the clock cycle for reading the last burst-length data by the cycle(s) of the CAS latency or greater, since the array is inactivated before data is read from a memory cell. However, an internal data read circuit can transfer burst-length data even when the array returns to a precharge state (i.e., the internal read circuit operates independently of row-related circuitry and successively transfers burst-length data).

Since a mode of operation is designated by a combination of the states of external signals at a rising edge of clock signal CLK and data is input or output in synchronization with a clock signal, the timing of an internal operation can be determined without taking the skew of each control signal into consideration and thus the internal operation can be started at an earlier timing and hence fast access can be achieved. Furthermore, since output data is made definite in synchronization with clock signal CLK, an external device can sample data at a rising edge of clock signal CLK and data can be read and written at the same rate as that of clock signal CLK and hence fast data transfer is accomplished.

FIG. 40 is a timing chart representing an operation in writing data of a conventional synchronous semiconductor memory device. Referring to FIG. 40, the data write operation will now be described. In FIG. 40, an active command is applied in clock cycle #0 and the array is driven to an active state.

Then, in clock cycle #2 at the rising edge of clock signal CLK, chip select signal /CS, column address strobe signal /CAS and write enable signal /WE are each set to a low level and row address strobe signal /RAS is set to a high level. This state combination is referred to as a write command and designates writing data. When a write command is applied, an operation for selecting a column of memory cells is performed using an address signal AD applied when the write command is applied as a column address signal. In writing data, data to be written is provided simultaneously with the write command and data D0 provided in clock cycle #2 is taken into the synchronous semiconductor memory device. Thereafter, written data D1, D2 and D3 are successively written in clock cycles #3, #4 and #5, respectively. In writing data also, the burst address generator internally operates to generate burst addresses for successive column select operations and write data D0–D3 are internally written successively into selected columns of memory cells in a predetermined sequence.

When writing data operation is completed, a precharge command is applied at the rising edge of the clock signal CLK in clock cycle #6 and the array is driven to an inactive state. In writing data also, a precharge command cannot be applied until the period corresponding to the CAS latency in reading data elapses after the writing of burst-length data is completed. In writing data also, the number of data which can be successively written with one write command is referred to as a burst length. More specifically, burst length represents the number of data which can be successively accessed when an access command for designating writing/reading data, e.g., write command or read command, is applied.

In writing data also, data to be written is taken into the semiconductor memory device in synchronization with the clock signal. Thus, data can be written at the same rate as clock signal CLK and fast writing can thus be achieved.

As described above, a synchronous semiconductor memory device takes external signals and outputs read data in synchronization with a clock signal and thus allows fast data transfer. However, to switch pages (i.e., to select another word line) in a synchronous semiconductor memory device with only one array, such a sequence is needed that a precharge command is once applied in order to inactivate the array and then again an active command is applied in order to drive a new page (a word line) to a selected state. Accordingly, the page switching period prevents data transfer and hence fast access. In order to avoid access interruption in switching pages and the like, the synchronous semiconductor memory device is configured into a plurality of banks which can be driven to an active state/inactive state independently of each other and successively activated and inactivated in a predetermined sequence so that the precharge time can be externally concealed and fast access can be achieved.

An operation of a synchronous semiconductor memory device of the bank configuration will now be described. FIG. 41 schematically shows the entire configuration of a synchronous semiconductor memory device including a plurality of banks BK0–BK$n$. Bank control circuits BCT0–BCT$n$ are provided for banks BL0–BK$n$, respectively. Bank control circuits BCT0–BCT$n$ receive a bank address signal BA from a bank address buffer BAB and an operation mode designating signal from a control input buffer CIB which in turn receives control signal /CS, /WE, /CAS and /RAS. Banks BK0–BK$n$ are commonly coupled with an input/output circuit IOB.

Each of bank control circuits BCT0–BCT$n$ is activated when a bank address signal from bank address buffer BAB specifies a corresponding bank, to control the operation of the corresponding bank in response to an operation mode designating signal output from control input buffer CAB. Since the activation/inactivation of bank control circuits BCT0–BCT$n$ is designated by bank address signal from bank address buffer BAB, bank control circuits BCT0–BCT$n$ can independently drive the respective banks BK0–BK$n$ to active/inactive state. Note that banks BK0–BK$n$ each have a plurality of memory cells arranged in a matrix.

One example of the operation sequence of the semiconductor memory device with a plurality of banks shown in FIG. 41 will now be described with reference to FIG. 42. FIG. 42 represents an operation in reading data for a burst length of four and CAS latency of four. An active command is applied in clock cycle #0, and bank activating operation is performed in response to a bank address signal of address signal AD (not shown in FIG. 41). Bank address signal BA applied simultaneously with the active command designates bank BK0, and bank control circuit BCT0 activates bank BK0.

A read command is applied in clock cycle #2, and using an address applied when the read command is applied as a column address signal (Y), a column select operation is performed. Bank address signal BA designates bank BK0, and bank control circuit BCT0 selects and connects a corresponding memory cell of bank BK0 to input/output circuit IOB to transmit the data of the selected memory cell in bank BK0 to input/output circuit IOB. Since the CAS latency is two, the data read from bank BK0 is defined at the rising edge of clock signal CLK in clock cycle #4. Since the burst length is four, data Q0, Q1, Q2 and Q3 are successively read from bank BK0.

In clock cycle #4, an active command is again applied and bank address BA designates bank BK1. Bank control circuit BCT1 is activated which activates bank BK1 according to the active command from control input buffer CIB.

At the rising edge of clock signal CLK in clock cycle #6, a read command is applied together with a bank address which in turn designates bank BK1. Bank control circuit BCT1 is activated, a memory cell in bank BK1 is selected and the data of the selected memory cell is read. The data from bank BK1 is defined after two clock cycles. Accordingly, after data Q3 from bank BK0 is read in clock cycle #7 in successively reading the burst-length data from bank BK0, data Q0 ... from bank BK1 are successively read starting at clock cycle #8.

While the data are read, a precharge command is applied in clock cycle #7. Together with the precharge command, a bank address for designating bank BK0 is applied to designate precharging the bank BK0 and bank BK0 is then inactivated under the control of bank control circuit BCT0. An active command is then applied in clock cycle #8, and bank address BA applied when the active command is applied designates bank BK2.

At the rising edge of clock signal CLK in clock cycle #12, a read command is applied together with bank address BA which in turn designates bank BK2. Thus, after data Q3 from bank BK1 is read in clock cycle #11, the data from the bank BK2 are read successively.

Since a plurality of banks are activated/inactivated in a predetermined order, as shown in FIG. 42, data can be read while concealing the time for precharging the banks and fast reading can thus be achieved. The sequence of successively activating the banks in a predetermined sequence and selecting memory cells writing data. Since the banks are successively activated and write commands are applied, writing data in switching pages can be done by switching the banks and thus data can be written successively.

The operation will now be described for successively precharging eight banks BK0–BK7 as banks BK0–BK$n$ while writing data into one bank BK0 under a condition of a burst length of eight, a CAS latency of three and a RAS precharge cycle of three clock cycles. Here, the RAS precharge cycle is a period required till activating a bank after a precharge command is applied to the bank.

Referring to FIG. 43, an active command is applied in clock cycle #1 and bank BK0 is activated.

In clock cycle #4, a write command is applied to designate writing data into bank BK0, and the data D0 provided in clock cycle #4 is written into bank BK0. Thereafter, written data D1–D7 provided in clock cycles #5–#11 are successively written into bank BK0.

Meanwhile, precharge commands are applied from clock cycle #5 through clock cycle #11 while changing a bank address for each clock cycle to successively designate banks BK1–BK7 so that banks BK1–BK7 are precharged successively.

In clock cycle #11, writing data into bank BK0 is completed and a precharge command is applied to bank BK7. Again, all the control signals are once set to high level and an NOP (no operation) command is set. Thus, any new operation is not designated in the synchronous semiconductor memory device.

In clock cycle #13, a precharge command is applied for bank BK0. Writing all the data in bank BK0 is completed and then bank BK0 is precharged. With the RAS precharge clock cycle of three, an active command for bank BK7 can be applied in clock cycle #14 and bank BK7 can thus be activated. Then, an active command for bank BK0 is applied in clock cycle #17. This operation is repeated thereafter.

For the operation sequence shown in FIG. 43, a data write mask command (a write word mask command) DQM is in a low-level inactive state and data to be written cannot be masked. In other words, supplied data to be written D0–D7 are all written into bank BK0. However, when a precharge command and a bank address are used to return one bank to a precharge state in each clock cycle, a long period of time is disadvantageously required for inactivating all of the banks.

FIG. 44 represents another operation sequence in writing data. The figure also represents the operation in which bank BK0 has data of a burst length of eight written thereinto while the other banks are successively precharged. In FIG. 44, write word mask commands are applied in clock cycles #7 and #10 with signal DQM set to high level and thus writing for the data words is prohibited in these clock cycles. The write word mask command, which is an external signal, is a type of command, and inputting two commands simultaneously in the same cycle is prohibited to reduce the load on an external controller. Thus, when write word mask command DQM is set to an active state, external control signals /CS, /RAS, /CAS and /WE are set to NOP command state. In this state a processing for merely masking writing data is performed.

More specifically, a precharge command for a bank cannot be applied in clock cycles #7 and #10. Thus, in the operation sequence shown in FIG. 44, bank BK7 receives a precharge command in clock cycle #13 and is thus precharged. Precharging the bank BK0 is designated in the next clock cycle #14. Since the RAS precharge cycle is three clock cycles, an active command for bank BK7 can be applied in clock cycle #16 and an active command for bank BK0 can be applied in the next clock cycle #17.

Thus, when the write word masking is used in a clock cycle, commands such as active command and precharge command cannot be input in that clock cycle. Thus, it is not allowed to apply active and precharge commands successively to other banks for successively activating/inactivating the banks in an interleaving manner to achieve fast access.

In reading data also, command DQM instructs read word masking, and a similar problem arises.

The synchronous semiconductor memory device supports an all-bank precharge command for precharging all banks simultaneously. FIG. 45 represents the all-bank precharge command. More specifically, the all-bank precharge command is applied by setting chip select signal /CS, row address strobe signal /RAS and write enable signal /WE to low level and column address strobe signal /CAS and a particular address signal bit Ad10 to high level at a rising edge of clock signal CLK. In this state, precharging all the banks is designated. When address bit Ad10 is set to low level, a single-bank precharge command is applied to precharge the bank specified by the current bank address.

The use of such an all-bank precharge command allows all banks to be precharged simultaneously. However, when all banks are precharged simultaneously, the banks have to be successively activated by active commands and such generation sequence adversely affects the advantage of the bank configuration that banks can be activated/inactivated in an interleaving manner for writing/reading data to achieve fast data transfer.

Furthermore, if the number of banks is increased, these banks are successively activated/inactivated is write/read data. However, synchronous semiconductor memory devices have the conditions referred to as CAS latency and burst length for reading data and also have RAS precharge cycle and RAS-CAS delay cycle (i.e., the time required from application of an active command until the first application of a read/write command) corresponding to the RAS/CAS delay time of the standard DRAMs. Thus, the control for periodically activating/inactivating a number of banks while satisfying the conditions is extremely complicated, and thus each bank cannot be readily accessed in an interleaving manner.

In particular, is a case in which the number of banks is increased, when active, read/write and precharge commands are periodically applied to access each bank in a predetermined sequence, and if active, read/write and precharge commands are applied in each clock cycle, and a periodic command application sequence is to be implemented, a plurality of commands may have to be applied in one clock cycle depending on the conditions of CAS latency, burst length, RAS precharge cycle and RAS-CAS delay cycle. The regularity in the command application sequence is deteriorated and hence the continuity in data access control, and thus fast data transfer cannot be achieved.

Such synchronous semiconductor memory devices are subject to various tests in the manufacturing process in order to ensure their reliability. Such tests require writing/reading data in order to determine whether data is read/written accurately. However, if the number of banks is increased, the control for successively activating banks in a predetermined sequence and in an interleaving manner to read/write data becomes complicated, as described above, and thus data cannot be read/written at high speed. In particular, testing requires reading/writing data from/into all of the memory cells in a semiconductor memory device. Accordingly, if the interleaving of the respective banks as described above cannot readily be achieved, data cannot be read/written fast and testing time is disadvantageously increased.

Furthermore, in precharging banks with the all-bank precharge command, all banks must be in a prechargeable state and the timing of application of the all-bank precharge command is limited to a timing prior to reading the last data in successive data and the like. Thus, it is difficult to use the all-bank precharge command to achieve successive access.

Furthermore, a memory cell select command, such as active command and read/write command, is used together with a bank address signal specifying a bank in which a memory cell is selected and a memory cell select operation is performed in the specified bank. Accordingly, a plurality of banks cannot be accessed simultaneously and are thus inconvenient for some content of the processing.

SUMMARY OF THE INVENTION

An object of the present invention is to provide a multi-bank synchronous semiconductor memory device capable of selecting memory cells at high speed and accessing data without conflict of commands.

Another object of the present invention is to provide a multi-bank synchronous semiconductor memory device capable of writing data at high speed.

Still another object of the present invention is to provide a multi-bank synchronous semiconductor memory device capable of reducing testing time.

A semiconductor memory device according to the present invention includes: a plurality of banks capable of being driven independently from each other to active and inactive states; a plurality of memory cell select units each provided for each of the plurality of banks, for performing an operation for selecting a memory cell in a corresponding bank when activated; and a control unit responsive to an operation mode designating signal and to an instruction of memory cell selection for simultaneously activating the memory cell select units provided for a predetermined number of one or more banks among the plurality of memory cell select units.

In a mode of operation specified by the operation mode designating signal, when an instruction that a memory cell is to be selected is provided, memory cells are simultaneously selected in a predetermined number of banks of the plurality of banks. Thus, a plurality of banks can be driven simultaneously and a command application sequence need not be considered. Furthermore, in contrast with driving of the banks individually for testing, commands do not conflict and testing time can be significantly reduced.

Furthermore, in writing testing data, the data can be simultaneously written into banks which are simultaneously driven to the selected state, and testing data writing time can be reduced. In reading the testing data, use of compression or the like allows reading data from simultaneously selected banks, reducing the time required for reading testing data.

In the normal data processing also, the same data can be simultaneously written into a plurality of banks and thus the flexibility of the processing is enhanced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a timing chart for representing the states of external control signals for performing the disturb refresh.

FIG. 40 is a timing chart for representing an operation in writing data in a conventional synchronous semiconductor memory device.

FIG. 42 is a timing chart for representing an operation in reading data in the synchronous semiconductor memory device shown in FIG. 41.

FIG. 44 is a diagram for explaining a problem of a conventional synchronous semiconductor memory device.

DESCRIPTION OF THE PREFERRED EMBODIMENTS

First Embodiment

Figure 1:
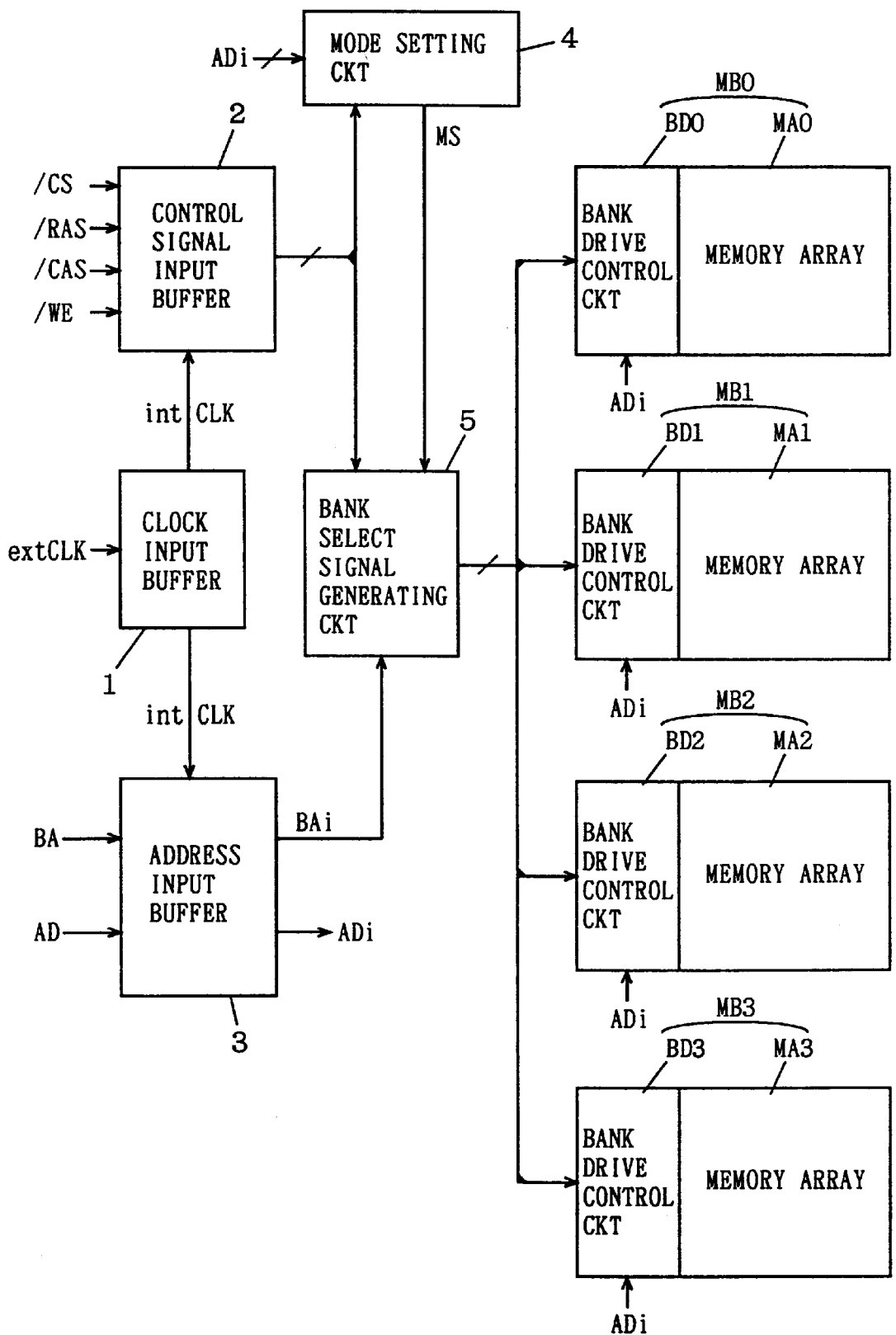
FIG. 1 schematically shows the entire configuration of a semiconductor memory device as an implementation of the present invention.

FIG. 1 schematically shows the entire configuration of a semiconductor memory device according to a first embodiment of the present invention. The semiconductor memory device includes a plurality of memory banks which can be independently driven to active/inactive states from each other. FIG. 1 shows four memory banks MB0–MB3 as one example. Memory banks MB0–MB3 includes memory arrays MA0–MA3 each having a plurality of memory cells arranged in a matrix respectively, and bank drive control circuits BD0–BD3 for selecting/deselecting memory cells of the memory arrays and for reading/writing data respectively.

The semiconductor memory device further includes: a clock input buffer 1 which receives an externally applied external clock signal extCLK such as system clock, to generate an internal clock signal intCLK; a control signal input buffer 2 which takes external control signals /CS, /RAS, /CAS and /WE at a rising edge of internal clock signal intCLK to generate an internal control signal; an address input buffer 3 which takes external address signal AD and bank address signal BA at a rising edge of internal clock signal intCLK to generate an internal address signal ADi and an internal bank address signal BAi; a mode-setting circuit 4 which receives the internal control signal from control signal input buffer 2 and internal address signal ADi from address input buffer 3 and outputs a mode-setting indicating signal (an operation mode designating signal) MS for indicating that a specific mode of operation is designated when the received signals are in predetermined states; and a bank select signal generating circuit 5 which receives the internal control signal from control signal input buffer 2, internal bank address signal BAi from address input buffer 3 and mode-setting signal MS from mode setting circuit 4 to generate an operation mode designating signal according to a combination of the states of the internal control signals and apply the generated signal to a bank specified by internal bank address signal BAi.

When mode-setting indicating signal MS from mode setting circuit 4 is set to an active state, bank select signal generating circuit 5 ignores internal bank address signal BAi from address input buffer 3 and applies an operation mode designating signal according to a combination of the states of control signals from control signal input buffer 2, i.e., a command, to each of memory banks MB0–MB3. Thus, when mode-setting indicating signal MS is activated, memory banks MB0–MB3 are simultaneously driven to active/inactive state.

Since bank address signal BAi can be selectively set to valid/invalid state in response to mode-setting indicating signal MS from mode setting circuit 4, as shown in FIG. 1, a plurality of banks can be simultaneously set to the active state depending on the mode of operation. A configuration of each of the portions mentioned above will now be described before describing a specific operation for simultaneously activating a plurality of banks.

Clock Input Buffer

Figure 2A:
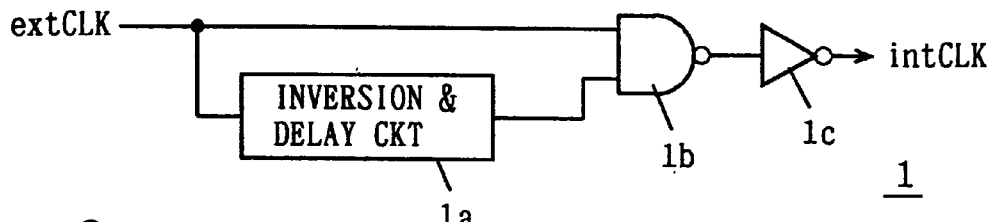
FIG. 2A shows a configuration of the clock input buffer shown in FIG. 1

FIG. 2A shows one example of the configuration of clock input buffer 1 shown in FIG. 1. Referring to FIG. 2A, the clock input buffer 1 includes: an inversion and delay circuit 1a which delays by a predetermined period time and inverts external clock signal extCLK; an NAND circuit 1b which receives an output signal from inversion and delay circuit 1a and external clock signal extCLK; and an inverter 1c which inverts an output signal from NAND circuit 1b to generate internal clock signal intCLK. Inversion and delay circuit 1a is constituted, for example, by inverters of an odd number of stages.

Figure 2B:
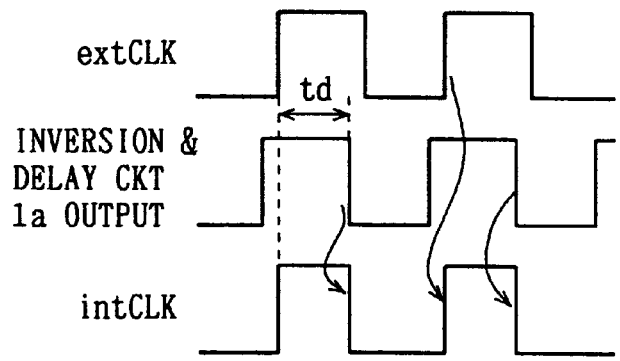
FIG. 2B shows the operation waveform of the buffer of FIG. 2A.

An operation of the clock input buffer shown in FIG. 2A will now be described with reference to the signal waveform diagram shown in FIG. 2B. Inversion and delay circuit 1a has a delay time td. When external clock signal extCLK rises to a high level, the output signal of inversion and delay circuit 1a attains a high level, the output signal from NAND circuit 1b responsively attains a low level and internal clock signal intCLK from inverter 1c rises to a high level. When delay time td elapses, the output signal from inversion and delay circuit 1a falls to a low level, the output signal from NAND circuit 1b attains a high level and responsively internal clock signal intCLK falls to a low level. Thus, even if internal clock signal intCLK rises to a high level in synchronization with a rising of external clock signal extCLK, it falls to a low level when delay time td of inversion and delay circuit 1a elapses.

Thus, when a high level period of external clock signal extCLK is longer than delay time td, the high level period of internal clock signal intCLK is rendered equal to delay time td of inversion and delay circuit 1a. Thus, even if external clock signal extCLK falls at a delayed timing due to noise or the like, internal clock signal intCLK falls at an unchanged timing, so that a circuit portion of the internal circuit that operates in synchronization with falling of internal clock signal intCLK can operate at a constant timing and thus the internal circuit can be prevented from operating at delayed timings. When external clock signal extCLK has its pulse width shorter than the delay time of inversion and delay circuit 1a due to influences of noise, the high level period of internal clock signal intCLK is reduced. In this case, however, there is no particular problem, since the operation of the internal circuit is started at an advanced timing and thus the internal circuit can be operated at the advanced timing.

Control Signal Input Buffer

Figure 3:
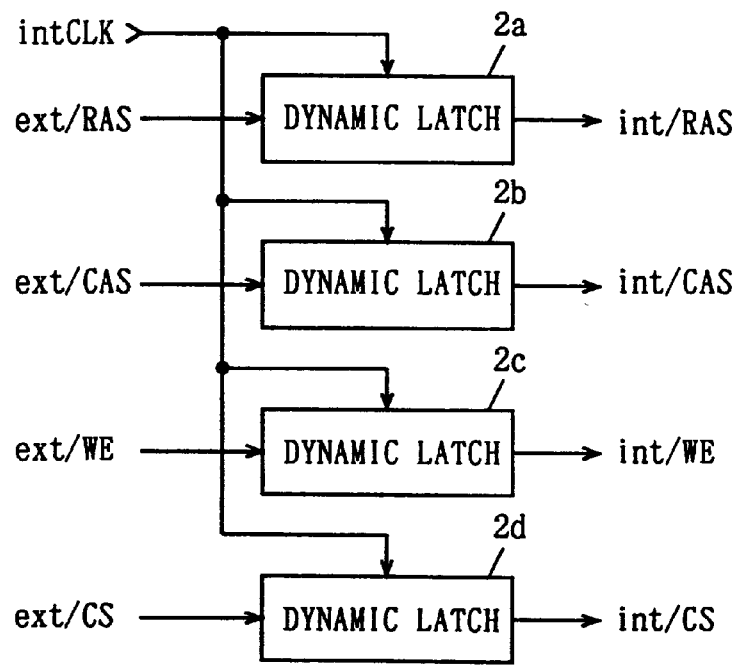
FIG. 3 schematically shows a configuration of the control signal input buffer shown in FIG. 1.

FIG. 3 schematically shows a configuration of control signal input buffer 2 shown in FIG. 1. In FIG. 3, control signal input buffer 2 includes dynamic latches 2a, 2b, 2c and 2d provided for external control signals ext/RAS, ext/CAS, ext/WE and ext/CS, respectively, each for latching a signal applied at a rising edge of internal clock signal intCLK from clock input buffer 1 shown in FIG. 1. Dynamic latches 2a, 2b, 2c and 2d output control signals int/RAS, int/CAS, int/WE and int/CS, respectively. Dynamic latches 2a–2d have a same configuration, and are set to a precharge state when internal clock signal intCLK attains a low level, to precharge internal control signals int/RAS, int/CAS, int/WE and int/CS to high level. With the use of dynamic latches 2a–2d, external control signals ext/RAS, ext/CAS, ext/WE and ext/CS can be taken at a rising edge of internal clock signal intCLK and their states can surely be determined.

Figure 4A:
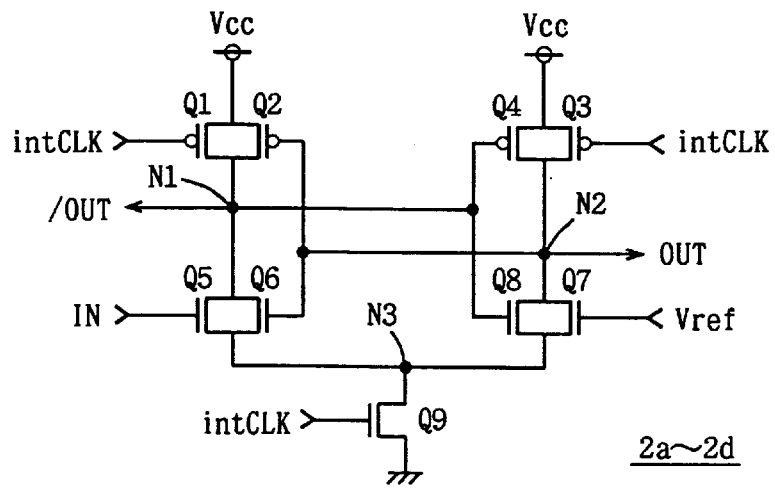
FIG. 4A shows a configuration of the dynamic latch shown in FIG. 3

FIG. 4A shows a configuration of dynamic latches 2a–2d shown in FIG. 3. Since dynamic latches 2a–2d have a common configuration, FIG. 4A shows a configuration of one dynamic latch and an input signal IN represents external control signals ext/RAS, ext/CAS, ext/WE and ext/CS, and an output signal OUT represents internal control signals int/RAS, int/CAS, int/WE and int/CS.

In FIG. 4A, the dynamic latch includes: a p-channel MOS transistor Q1 connected between a power supply node and an output node N1 and receiving internal clock signal intCLK at its gate; a p-channel MOS transistor Q2 connected in parallel with p-channel MOS transistor Q1 and having its gate connected to an output node N2; an n-channel MOS transistor Q5 connected between node N1 and a node N3 and having its gate receiving input signal IN; an n-channel MOS transistor Q6 connected in parallel with n-channel MOS transistor Q5 and having its gate connected to output node N2; a p-channel MOS transistor Q3 connected between a power supply node and output node N2 and having its gate receiving internal clock signal intCLK; a p-channel MOS transistor Q4 connected between the power supply node and output node N2 and having its gate connected to output node N1; an n-channel MOS transistor Q7 connected between output node N2 and node N3 and having its gate receiving a reference voltage Vref; an n-channel MOS transistor Q8 connected between output node N2 and node N3 and having its gate connected to output node N1; and an n-channel MOS transistor Q9 connected between node N3 and a ground node and having its gate receiving internal clock signal intCLK. Output node N1 outputs a complementary output signal /OUT with respect to input signal IN, and output node N2 outputs output signal OUT which is the same in logic as input signal IN.

Figure 4B:
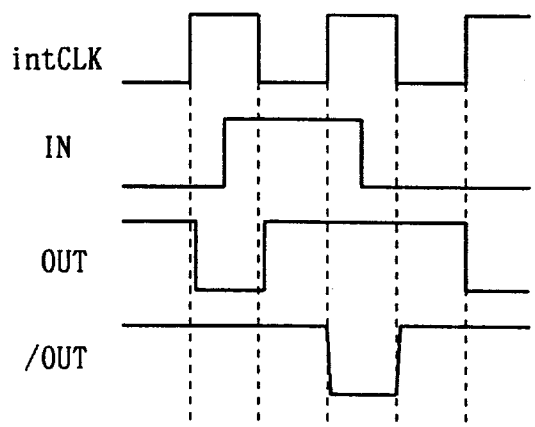
FIG. 4B shows the signal waveform representing the operation of the dynamic latch of FIG. 4B.

An operation of the dynamic latch shown in FIG. 4A will now be described with reference to the operation waveform diagram shown in FIG. 4B.

When internal clock signal inCLK attains a low level, p-channel MOS transistors Q1 and Q3 are turned on and n-channel MOS transistor Q9 is turned off. In this state, output nodes N1 and N2 are precharged to the level of power supply voltage Vcc via p-channel MOS transistors Q1 and Q3.

When internal clock signal intCLK rises to a high level, n-channel MOS transistors Q1 and Q3 are turned off and n-channel MOS transistor Q9 is turned on so that internal node N3 is coupled with the ground node. At the rising edge of internal clock signal intCLK, output nodes N1 and N2 are each in a high level (the level of power supply voltage Vcc) and p-channel MOS transistors Q2 and Q4 are each in an off state.

When input signal IN attains a low level, the conductance of n-channel MOS transistor Q7 is made larger than that of n-channel MOS transistor Q5 and the potential of node N2 drops. According to the potential drop of node N2, p-channel MOS transistor Q2 is turned on, current is supplied to node N1 and the output node N1 is maintained at the high level. Meanwhile, since the output node N1 attains a high level, p-channel MOS transistor Q4 is maintained in an off state and thus node N2 is discharged to the level of the ground potential via MOS transistors Q7 and Q8 and attains a low level.

The current supplying capability of p-channel MOS transistors Q2 and Q4 is larger than that of n-channel MOS transistors Q7 and Q5. Accordingly, once a latch state is attained and MOS transistors Q6 and Q8 are turned off and on, respectively, output node N1 maintains the high level and the latch state is not changed even when input signal IN rises from the low level to the high level, since MOS transistor Q6 is held in the off state and the current supplying capability of MOS transistor Q2 is larger than that of MOS transistor Q5.

When internal clock signal intCLK again falls to the low level, n-channel MOS transistor Q9 is turned off, p-channel MOS transistors Q1 and Q3 are turned on and output nodes N1, N2 are charged to the high level.

When input signal IN is in the high level at a rising edge of internal clock signal intCLK, output node N1 is discharged to the level of the ground voltage, MOS transistors Q4 and Q8 are turned on and off, respectively, and output node N2 is maintained at the high level. Thus, output signal OUT is held at the state of input signal IN at the rising edge of clock signal intCLK while internal clock signal intCLK is in the high level. In the dynamic latch shown in FIG. 4A, the levels of output signals OUT an /OUT are determined only by discharging one of output nodes N1 and N2 at a rising edge of the clock signal, which ensures rapid generation of internal control signals.

Mode Setting Circuit

Figure 5:
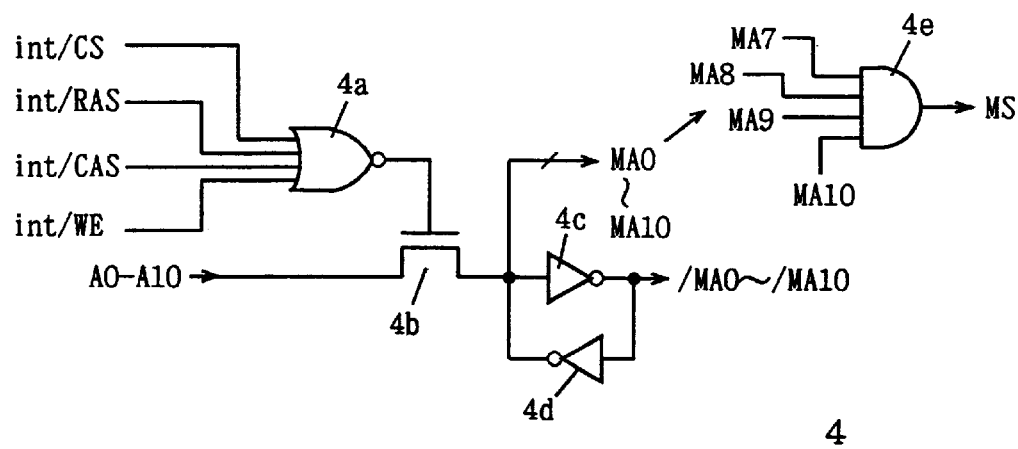
FIG. 5 shows a configuration of the mode setting circuit shown in FIG. 1.

FIG. 5 shows a configuration of mode setting circuit 4 shown in FIG. 1. Referring to FIG. 5, the mode setting circuit 4 includes: an NOR gate 4a which receives internal control signals int/CS, int/RAS, int/CAS, int/WE from the control signal input buffer; a transfer gate 4b formed of an n-channel MOS transistor and turned on when an output signal from NOR gate 4a attains a high level to pass internal address signal bits MA0–MA10 from the address input buffer; and inverters 4c and 4d which latch address signal bits from transfer gate 4b. Inverter 4c generates complementary internal address signal bits /MA0–/MA10. Transfer gate 4b generates internal address signal bits MA0–MA10.

Mode setting circuit 4 further includes an AND gate 4e which receives predetermined address signal bits MA7–MA10 out of address signal bits MA0–MA10 latched by the inverter latch and outputs a mode-setting indicating signal MS.

In the configuration of mode-setting circuit 4 shown in FIG. 5, mode-setting indicating signal MS attains an active high level when internal control signals int/CS, int/RAS, int/CAS and int/WE are each set to a low level (i.e., the WCBR condition) and address signal bits A7–A10 are each set to a high level at a rising edge of clock signal intCLK. In other words, mode-setting indicating signal MS is activated by the so-called WCBR condition plus address key and designates activating a plurality of banks simultaneously.

Figure 6:
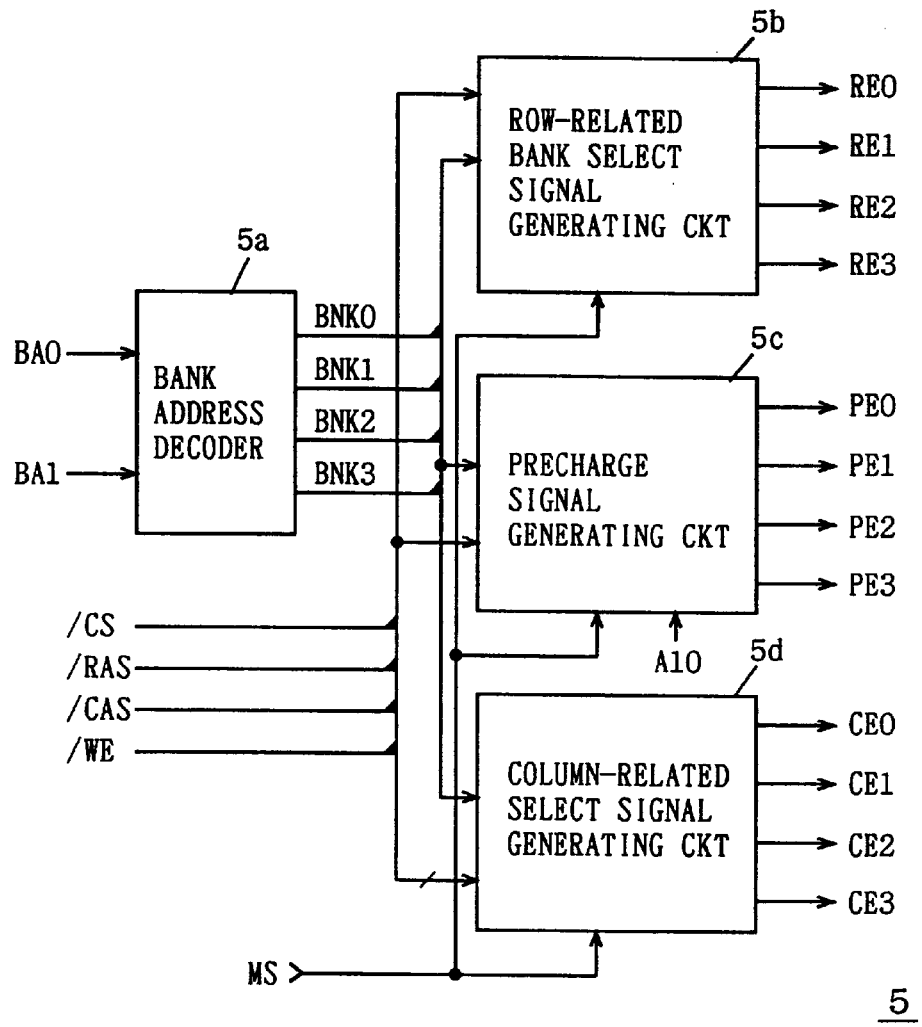
FIG. 6 schematically shows a configuration of the bank select signal generating circuit shown in FIG. 1.

FIG. 6 schematically shows a configuration of bank select signal generating circuit 5 shown in FIG. 1. The circuit 5 includes: a bank address decoder 5a which receives and decodes bank address signal bits BA0 and BA1 from the address input buffer and outputs bank specifying signals BNK0–BNK3; a row-related bank select signal generating circuit 5b which receives bank specifying signals BNK0–BNK3 from bank address decoder 5a, internal control signals /CS, /RAS, /CAS and /WE from the control signal input buffer and mode-setting indicating signal MS to output row-related activating signals RE0–RE3 for the banks; a precharge signal generating circuit 5c which receives bank specifying signals BNK0–BNK3, internal control signals /RAS, /CAS and /WE, a specific internal address signal bit A10 from the input buffer and mode-setting indicating signal MS to output precharge designating signals PE0–PE3 for the banks; and a column-related select signal generating circuit 5d which receives bank specifying signals BNK0–BNK3, internal control signals /CS, /RAS, /CAS and /WE and mode-setting indicating signal MS to output column-related activating signals CE0–CE3 for the banks. Here "int" representing an internal control signal is omitted in the figure.

In response to applied bank address signal bits BA0 and BA1, bank address decoder 5a drives one of bank specifying signals BNK0–BNK3 to a selected state. Row-related banks select signal generating circuit 5b drives to an active state a row-related activating signal for a bank specified by a bank specifying signal when the states of internal control signals /CS, /RAS, /CAS and /WE are indicative of the active command and mode-setting indicating signal MS is in an inactive state. Row-related bank select signal generating circuit 5b drives row-related activating signals RE0–RE3 for all the banks to the active state when an active command is applied and mode-setting indicating signal MS is in an active state.

Precharge signal generating circuit 5c drives a precharge designating signal for a bank specified by bank specifying signals BNK0–BNK3 to an active state when the states of control signals /CS, /RAS, /CAS, and /WE are indicative of the precharge command and address signal bit A10 is in a low level. Precharge signal generating circuit 5c drives precharge designating signals PE0–PE3 for all the banks to the active state when a precharge command is applied and address signal bit A10 is in a high level. Besides the single-bank precharge command and the all-bank precharge command, precharge signal generating circuit 5c drives all of precharge designating signals PE0–PE3 to the active state regardless of the logic level of address signal bit A10 when mode-setting indicating signal MS is activated and a precharge command is applied.

Column-related select signal generating circuit 5d drives a column-related activating signal for a bank specified by bank specifying signals BNK0–BNK3 to an active state when control signals /CS, /RAS, /CAS and /WE are set to the states indicative of a read or write command, i.e., an access command. When mode-setting indicating signal MS is in an active state, column-related select signal generating circuit 5d drives column-related activating signals CE0–CE3 for all banks to active state upon application of an access command.

Since the validity/invalidity of the bank specifying signals is controlled by mode-setting indicating signal MS, simultaneous operation of all banks or the operation of a single bank can be controlled.

Figure 7:
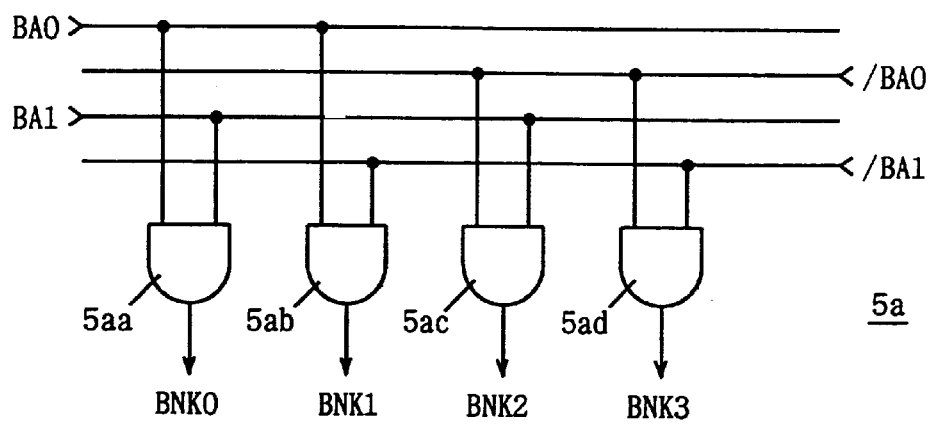
FIG. 7 schematically shows a configuration of the bank address decoder shown in FIG. 6.

FIG. 7 shows one example of the configuration of bank address decoder 5a shown in FIG. 6. Referring to FIG. 7, bank address decoder 5a includes: an AND circuit 5aa which receives bank address bits BA0 and BA1 and outputs bank specifying signal BNK0; an AND circuit 5ab which receives bank address signal bits BA0 and /BA1 and outputs bank specifying signal BNK1; an AND circuit 5ac which receives bank address signal bits /BA0 and BA1 and outputs bank specifying signal BNK2; and an AND circuit 5ad which receives bank address signal bits /BA0 and /BA1 and outputs bank specifying signal BNK3. Bank address signal bits /BA0 and BA1 are the address signal bits complementary to bank address signal bits BA0 and BA1. AND circuits 5aa–5ad drives the corresponding bank specifying signal to an active high level when they receive high level signals at their respective inputs.

Figure 8:
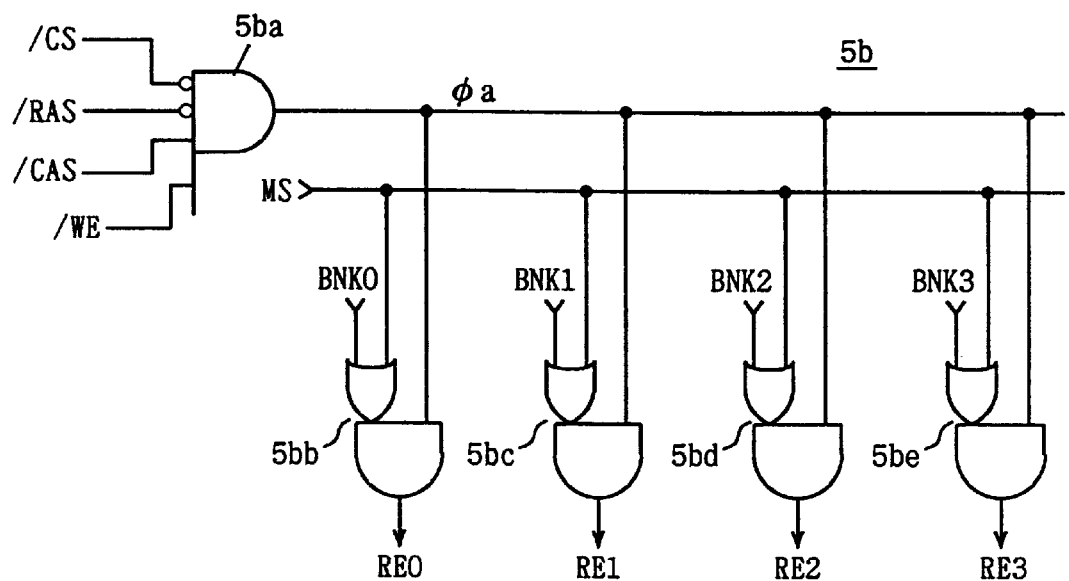
FIG. 8 schematically shows a configuration of the row-related bank select signal generating circuit shown in FIG. 6.

FIG. 8 shows an example of the configuration of row-related bank select signal generating circuit 5b shown in FIG. 6. Referring to FIG. 8, the circuit 5b includes: a gate circuit 5ba which receives chip select signal /CS, row address strobe signal /RAS and column address strobe signal /CAS to output an array activation designating signal $\phi a$; an AND/OR composite gate 5bb which receives bank specifying signal BNK0, mode-setting indicating signal MS and array activation designating signal $\phi a$ and outputs row-related activating signal RE0; an AND/OR composite gate 5bc which receives bank specifying signal BNK1, mode-setting indicating signal MS and array activation designating signal $\phi a$ and outputs row-related activating signal RE1; an AND/OR composite gate 5bd which receives bank specifying signal BNK2, mode-setting indicating signal MS and array activation designating signal $\phi a$ and outputs row-related activating signal RE2; and an AND/OR composite gate 5be which receives bank specifying signal BNK3, mode-setting indicating signal MS and array activation designating signal $\phi a$ and outputs row-related activating signal RE3.

Gate circuit 5ba activates array activation designating signal $\phi a$ when chip select signal /CS and row address strobe signal /RAS are each in a low level and column address strobe signal /CAS and write enable signal /WE are each in a high level. In other words, gate circuit 5ba detects application of the active command.

AND/OR composite gates 5bb–5be each include an OR gate which receives bank specifying signal BNK (BNK0–BNK3) and mode-setting indicating signal MS, and an AND gate which receives an output signal of the OR gate and array activation designating signal $\phi a$.

Thus, as shown in FIG. 8, activation of mode-setting indicating signal MS to high level equivalently causes all of bank specifying signals BNK0–BNK3 to be driven to selected level and activation of array activation designating signal $\phi a$ under this condition causes all of row-related activating signals RE0–RE3 to be driven to the active state so that the row-related circuitry operates in all the banks. Here, the row-related circuitry performs an operation related to selecting a row as described later.

When mode-setting indicating signal MS is at an inactive low level, a row-related activating signal for a bank specified by bank specifying signals BNK0–BNK3 is driven to an active state in response to array activation designating signal $\phi a$ and the operation related to selecting a row is performed only in the bank specified by the bank address signal.

Figure 9:
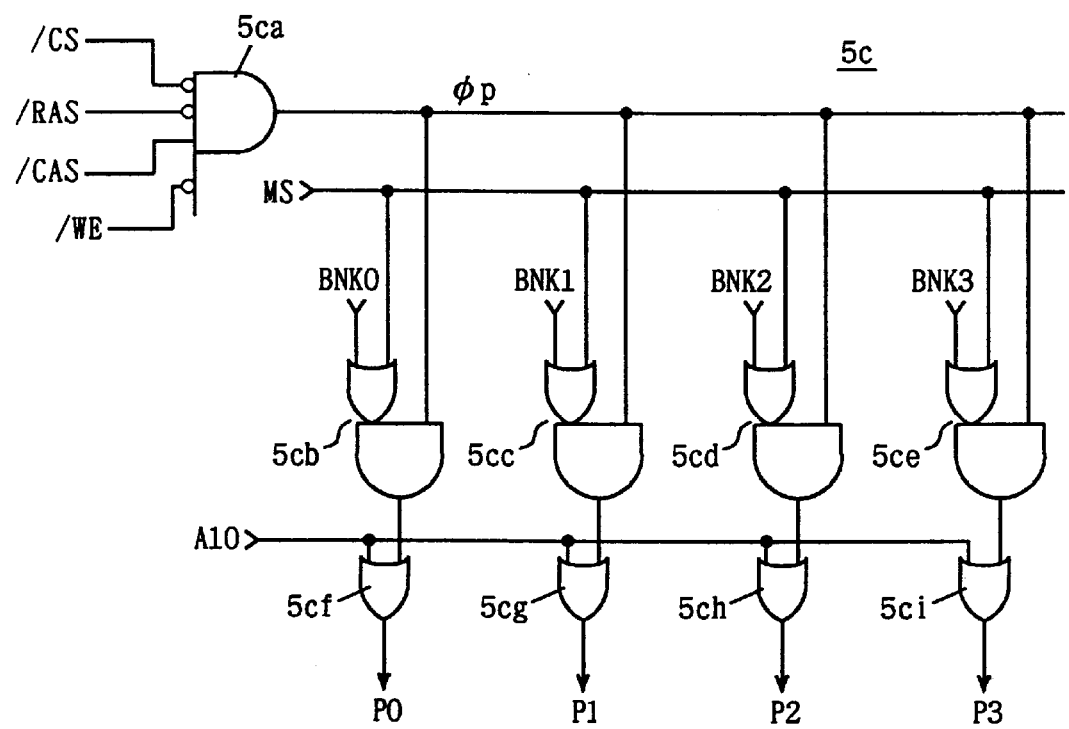
FIG. 9 schematically shows a configuration of the precharge signal generating circuit shown in FIG. 6.

FIG. 9 shows one example of the configuration of precharge signal generating circuit 5c shown in FIG. 6. Referring to FIG. 9, precharge signal generating circuit 5c includes: a gate circuit 5ca which receives chip select signal /CS, row address strobe signal /RAS, column address strobe signal /CAS and write enable signal /WE and outputs a precharge designating signal $\phi p$; an AND/OR composite gate 5*cb* which receives bank specifying signal BNK0, mode-setting indicating signal MS and precharge designating signal φp; an AND/OR composite gate 5*cc* which receives bank specifying signal BNK1, mode-setting indicating signal MS and precharge designating signal φp; an AND/OR composite gate 5*cd* which receives bank specifying signal BNK2, mode-setting designating signal MS and precharge indicating signal φp; an AND/OR composite gate 5*ce* which receives bank specifying signal BNK3, mode-setting indicating signal MS and precharge designating signal φp; an OR gate 5*cf* which receives an output signal of AND/OR composite gate 5*cb* and address signal bit A10 and outputs a precharge activating signal P0; an OR gate 5*cg* which receives address signal bit A10 and an output signal of AND/OR composite gate 5*cc* and outputs a precharge activating signal P1; an OR gate 5*ch* which receives an output of AND/OR composite gate 5*cd* and address signal bit A10 and outputs a precharge activating signal P2; and an AND/OR circuit 5*ci* which receives an output of AND/OR composite gate 5*ce* and address signal bit A10 and outputs precharge activating signal P3.

AND/OR composite gates 5*cb*–5*ce* has a same configuration equivalent to the configuration including an OR gate which receives bank specifying signal BNK (BNK0–BNK3) and mode-setting indicating signal MS and an AND gate which receives an output signal from the OR gate and precharge designating signal φp.

Gate circuit 5*ca* drives precharge designating signal φp to an active high level when chip select signal /CS, row address strobe signal /RAS and write enable signal /WE are each set to a low level and column address strobe signal /CAS is set to a high level and thus apply a precharge command is applied.

In precharge signal generating circuit 5*c*, as shown in FIG. 9, when mode-setting indicting signal MS attains an active high level, all of bank specifying signals BNK0–BNK3 are equivalently set to a selected state and under this condition and precharge activating signals P0–P3 for all the banks are driven to active high level in response to precharge designating signal φp.

When mode-setting indicating signal MS attains a low level, single-bank precharging or all-bank precharging is performed in response to precharge designating signal φp and address signal bit A10. More specifically, when precharge designating signal φp is in an active state and address signal bit A10 is at a low level, only a bank selected in response to bank specifying signals BNK0–BNK3 is precharged. In contrast, when address signal bit A10 is at a high level and precharge designating signal φp is in an active state, precharge activating signals P0–P3 are all driven to active state.

Mode-setting indicating signal MS is applied to precharge signal generating circuit 5*c* so as to perform memory cell select operation (active command and read/write command) for all banks when mode-setting indicating signal MS is activated, in a same manner of generation of control signals as with active command and read/write command. If only the precharge signal generating circuit receives the all-bank precharge command in place of the single-bank precharge command when mode-setting indicating signal MS is activated, a controller which applies the commands has its load increased.

Thus, in the configuration shown in FIG. 9, a signal of an OR of mode-setting indicating signal MS and address signal bit A10 may be applied to OR gates 5*cf*–5*ci* so that all the banks are instructed of precharging whenever the mode setting indicating signal MS is made active. In this configuration, AND/OR composite gates 5*cb*–5*ce* can simply be replaced by AND gates.

Figure 10:
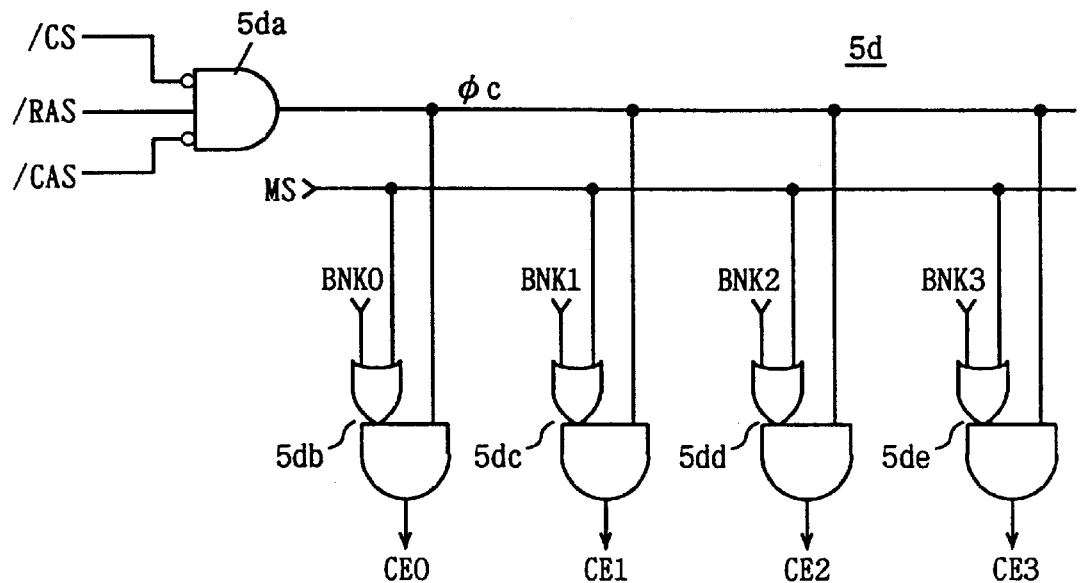
FIG. 10 schematically shows a configuration of the column-related select signal generating circuit shown in FIG. 6.

FIG. 10 shows one example of the configuration of column-related select signal generating circuit 5*d* shown in FIG. 6. Referring to FIG. 10, the column-related select signal generating circuit 5*d* includes: a gate circuit 5*de* which receives chip select signal /CS, row address strobe signal /RAS and column address strobe signal /CAS and outputs a column-related activating signal φc; an AND/OR composite gate 5*db* which receives bank specifying signal BNK0, mode-setting indicating signal MS and column-related activation designating signal φc and outputs column-related activating signal CE0 for bank MB0; an AND/OR composite gate 5*dc* which receives bank specifying signal BNK1, mode-setting activating signal MS and column-related activation designating signal φc and outputs column-related activating signal CE1 for bank MB1; an AND/OR composite gate 5*dd* which receives bank specifying signal BNK2, mode-setting indicating signal MS and column-related activation designating signal φc and outputs column-related activating signal CE2 for bank MB2; and an AND/OR composite gate 5*de* which receives bank specifying signal BNK3, mode-setting indicating signal MS and column-related activation designating signal φc and outputs column-related activating signal CE3 for bank MB3.

Gate circuit 5*da* drives column-related activation designating signal φc to an active high level when chip select signal /CS and column address strobe signal /CAS each attain a low level and row address strobe signal /RAS attains a high level. This state corresponds to the state that a read or write command is applied. Thus, activation of a portion related to selecting a column of memory cells is designated in response to activation of the column-related activation designating signal. Writing/reading data is identified by a read/write command decoder, i.e., activation/inactivation of the internal write and read circuits is designated according to the logic level of write enable signal /WE.

AND/OR composite gates 5*db*–5*de* have a same configuration and each equivalently includes an OR gate which receives bank specifying signal BNK (BNK0–BNK3) and mode-setting indicating signal MS and an AND gate which receives an output signal from the OR gate and column-related activation designating signal φc.

When mode-setting indicating signal MS attains an active high level in the configuration of column-related select signal generating circuit 5*d* shown in FIG. 10, column-related activating signal CE0–CE3 are all driven to active state in response to activation of column-related activation designating signal φc and the circuitry related to column selection operates in all the banks. In contrast, when mode-setting indicating signal MS attains an inactive low level, column-related designating signal is activated in response to column activating designation signal φc for a bank specified by activation bank specifying signals BNK0–BNK3.

Thus, the use of mode-setting indicating signal MS allows simultaneous operation of all banks as well as the operation of only a bank specified by a bank address signal.

Figure 11:
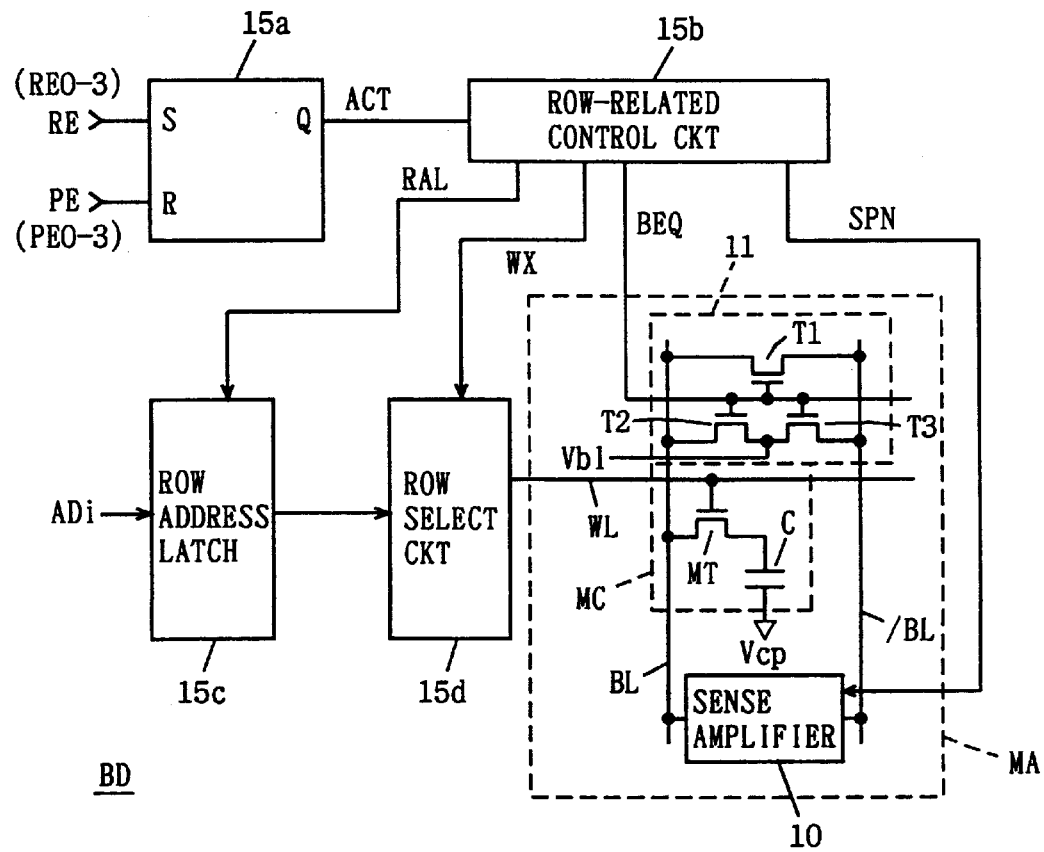
FIG. 11 schematically shows a configuration of the row-related control circuit and memory array.

FIG. 11 shows a configuration of a row-related control unit and a memory array in a single bank. The configuration shown in FIG. 11 is provided for each bank.

In FIG. 11, a memory array MA includes a plurality of memory cells arranged in a matrix, a word line arranged corresponding to each row of memory cells, and a pair of bit lines arranged corresponding to each column of memory cells. FIG. 11 representatively shows a single word line WL, a single pair of bit lines BL and /BL, and a memory cell MC arranged at the intersection of word line WL and bit line BL.

Memory cell MC includes a capacitor C having one electrode (a cell plate electrode) receiving a predetermined voltage Vcp (=Vcc/2), and an access transistor MT formed of an n-channel MOS transistor turned on in response to a signal potential on word line WL to connect the other electrode (a storage node) of capacitor C to bit line BL.

Bit lines BL and /BL are provided with a sense amplifier 10 which in turn differentially amplifies the potentials of bit lines BL and /BL when activated, and a bit-line precharger/equalize circuit 11 which precharges bit lines BL and /BL to a predetermined precharge potential Vbl (=Vcc/2) for equalization when activated. Sense amplifier 10 includes normal, cross-coupled p- and cross-coupled n-channel MOS transistors. Bit-line precharger/equalize circuit 11 includes an n-channel MOS transistor T1 which electrically short-circuits bit lines BL and /BL when it is turned on, and n-channel MOS transistors T2 and T3 which transmit bit-line precharge potential Vb1 to bit lines BL and /BL, respectively, when they are turned on.

The row-related drive control portion of bank drive control circuit BD includes: a set-reset flipflop 15a which is set in response to activation of row-related activating signal RE (RE0–RE3) and is reset in response to activation of precharge activating signal PE to output an array activating signal ACT; a row-related control circuit 15b which is responsive to activation of array activating signal ACT for outputting a row address latch designating signal RAL, a word-line drive signal WX, a bit-line equalization designating signal BEQ and a sense amplifier activating signal SPN at predetermined timings; a row address latch 15c which takes and latches internal address signal ADi applied from the address input buffer in response to activation of row address latch designating signal RAL from row-related control circuit 15b; and a row select circuit 15d under control of row-related control circuit 15b to decode a row address signal from row address latch 15c and drive a word line WL arranged corresponding to an addressed row of memory array MA to a selected state in response to word-line drive signal WX.

Row select circuit 15d decodes a row address signal applied when a row decoder enable signal (not shown) from row-related control circuit 15b is activated, for driving the addressed word line to a selected state in response to activation of word-line drive signal WX. Bit line equalization designating signal BEQ is applied to bit-line precharger/equalize circuit 11, and sense amplifier activating signal SPN is applied to sense amplifier 10.

Figure 12:
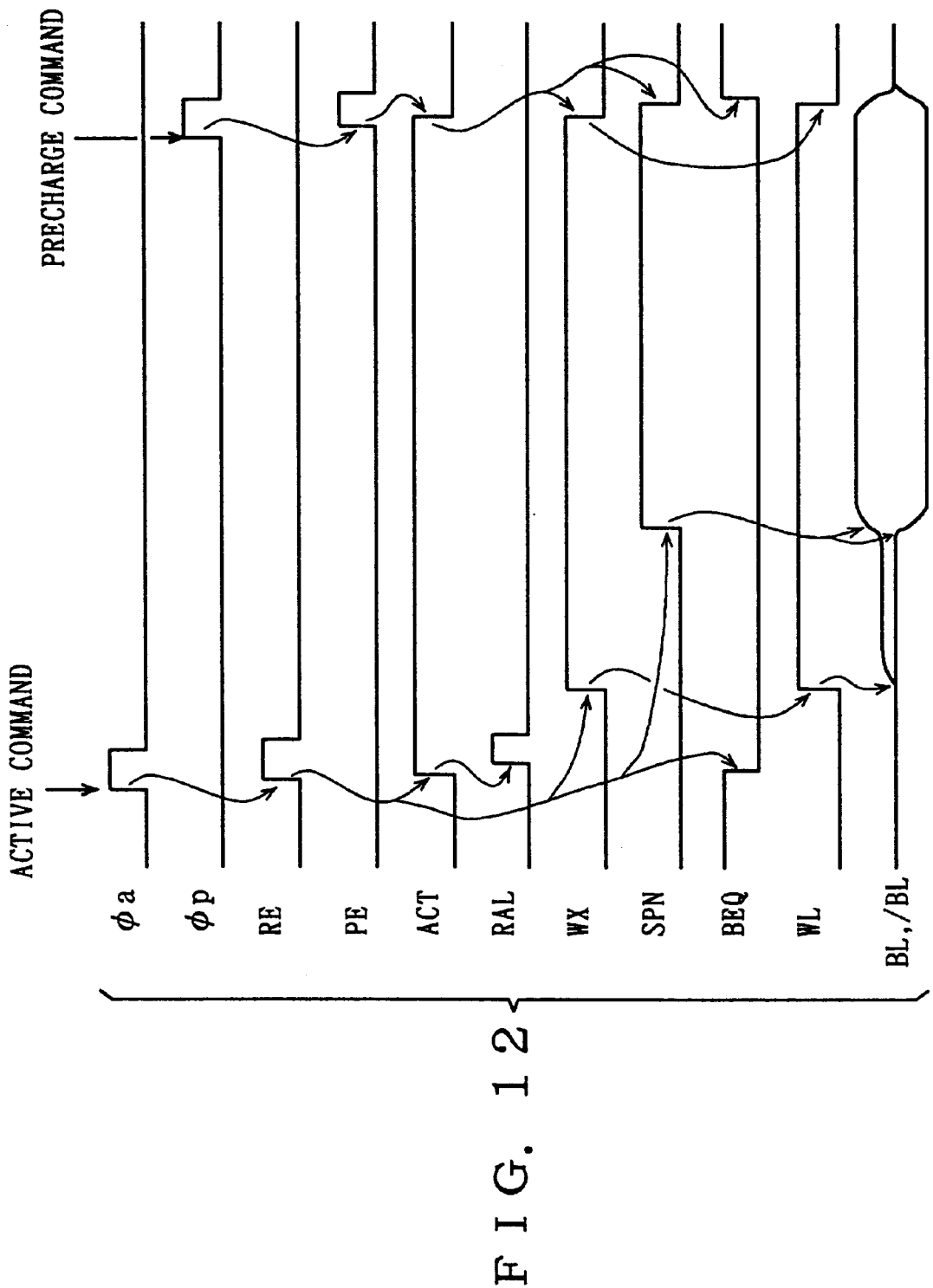
FIG. 12 is a signal waveform diagram representing an operation of the control circuit shown in FIG. 11.

FIG. 12 is a signal waveform diagram representing an operation for activating the array of the bank shown in FIG. 11, i.e., an operation of the row-related circuitry. The operation for activating/inactivating the array of the bank shown in FIG. 11 will now be described with reference to FIG. 12.

When an active command is applied, array activation designating signal φa from the command decoder is set to an active sate and row-related activating signal RE responsively attains an active high level for a predetermined period. Thus, set/reset flipflop 15a shown in FIG. 11 is set and array activating signal ACT is set to an active state. In response to the activation of array activating signal ACT, row-related control circuit 15b drives row address latch designating signal RAL to an active state for a predetermined period. Thus, row address latch 15c takes and latches an applied address signal ADi for application and inputs it to row select circuit 15d.

Row select circuit 15a is controlled by row-related control circuit 15b, to decode the internal row address signal from row address latch 15c and then drives the word line WL corresponding to the addressed row to a selected state (a high level) in response to activation of word-line drive signal WX. When the potential of the word line WL rises to a high level, access transistor MT of memory cell MC shown in FIG. 11 is turned on and the electric charge stored in capacitor C moves onto bit line BL. FIG. 12 shows one example of the change in potential of the bit line when capacitor C stores data of high level.

When the potential difference between bit lines BL and /BL is increased, sense amplifier activating signal SPN is then activated, sense amplifier 10 is activated, the potentials of bit lines BL and /BL are differentially amplified, and the potential of one bit line (BL) at higher potential and the potential of the other bit line (/BL) at lower potential are driven to the level of power supply voltage Vcc and the level of the ground potential, respectively.

While the array is in an active state, a sense operation of sensing and amplification of memory cell data by sense amplifier 10 is completed and the sense amplifier latches the data of a memory cell.

When a precharge command is applied, the command decoder generates precharge designating signal φp, responsively precharge activating signal PE is set to an active state for a predetermined period, set/reset flipflop 15a is reset, and array activating signal ACT attains an inactive low level. Thus, word-line drive signal WX is set to an inactive state and the potential of the selected word line WL attains a low level. Then, sense amplifier activating signal SPN is set to an inactive state, sense amplifier 10 is inactivated and an operation for latching the data of a memory cell is completed. Then, bit-line equalization designating signal BEQ is set to an active state and bit-line precharger/equalize circuit 11 is activated to precharge bit lines BL and /BL to the predetermined level of precharge potential Vb1. Thus, the array is set to an inactive state.

The operation for activating the array is performed in all banks when mode-setting indicating signal MS is in active state. Accordingly, the testing time required for the word-line disturb test (i.e., disturb refresh test) described below can be reduced more significantly than in conducting the same test for each bank.

Figure 13:
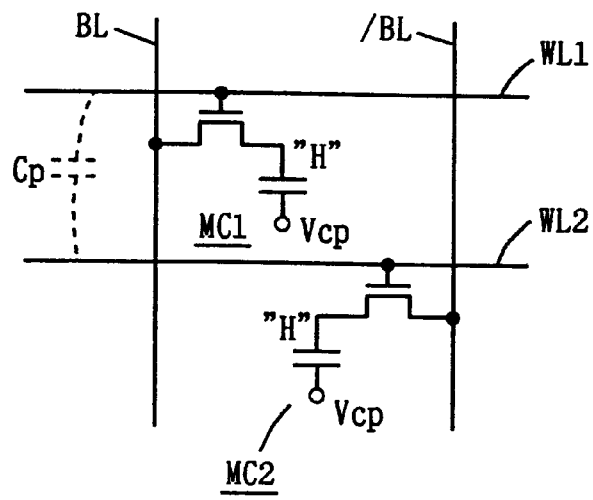
FIG. 13 is a diagram for explaining the disturb refresh test.

FIG. 13 is a diagram for explaining the word-line disturb (i.e., disturb refresh) operation. FIG. 13 shows a portion of word lines WL1 and WL2 and bit lines BL and /BL. A memory cell MC1 is arranged at the intersection of word line WL1 and bit line BL, and a memory cell MC2 is arranged at the intersection of word line WL2 and bit line /BL. Memory cells MC1 and MC2 are assumed to store data of high level. There is a parasitic capacitance Cp between word lines WL1 and WL2.

When word line WL1 is driven to a selected state, the potential of word line WL1 rises to a high level. The potential of non-selected word line WL2 also floats up due to the capacitive coupling of parasitic capacitance Cp. When the sense amplifier operates in this state, bit line BL is driven to a high level and bit line /BL is driven to a low level. When word line WL 2 has its potential floating up due to the capacitive coupling at the time of the selection of word line WL1, the access transistor of memory cell MC2 is turned on and the data of high level stored in the capacitor of memory cell MC2 is transmitted to the low-level bit line /BL. The leakage of electric charge decreases the amount of electric charge stored in the capacitor of memory cell MC2. Parasitic capacitance Cp between word lines is present not only between adjacent word lines but also between word lines distant from each other. When the amount of electric charge stored in a memory cell connected to a non-selected word line is reduced, the data stored in the memory cell will be lost before periodic refreshing thereof.

The flowing out amount of electric charge that is stored in the capacitor of a memory cell is increased as the frequency with which a word line is selected is increased. The number of times by which a word line is selected in a disturb refresh test is normally referred to as the frequency of disturbance. In such a disturb refresh test, a word line is driven to a selected state as many times as possible to increase the frequency of disturbance. Accordingly, the number of word lines driven to a selected state in the disturb refresh test is larger than the number of word lines simultaneously selected in the normal mode of operation (a memory array is divided into a plurality of array blocks and a word line is selected in each array block). In such a disturb refresh testing operation, disturb refresh testing time can be reduced by simultaneously testing all the banks. Furthermore, the frequency of disturbance can be increased for a same disturb refresh testing time.

A configuration for conducting such a disturb refresh test as described above will now be described.

Figure 14A:
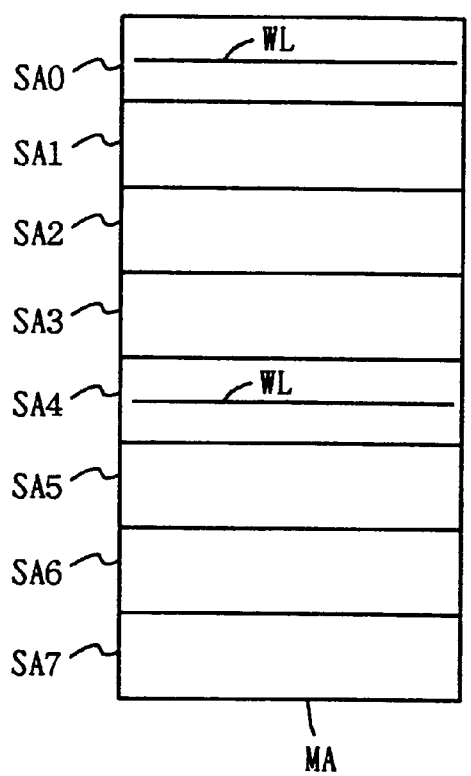
FIG. 14A shows a word-line selected state in the normal mode of operation and FIG. 14B shows a word-line selected state in the disturb refresh operation.

FIG. 14A shows memory array MA divided into a plurality (in FIG. 14A, eight) of subarrays SA0–SA7 in the column direction. In the normal mode of operation, two subarrays are selected from subarrays SA0–SA7 and a word line WL is selected in each selected subarray. FIG. 14A shows that word line WL is selected in each of subarrays SA0 and SA4.

Figure 14B:
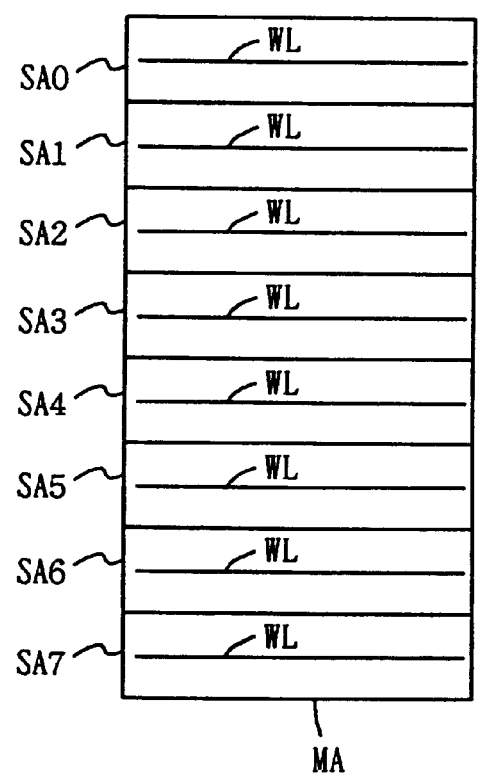

In disturb refresh testing, a word line is driven to a selected state in more subarrays, as shown in FIG. 14B. FIG. 14B shows as one example that word line WL is driven to a selected state in each of subarrays SA0–SA7. Thus, the frequency with which word line WL is driven to a selected state is increased within a limited period of time and the frequency of disturb refresh is increased so that the disturb refresh test can be conducted more accurately, since the frequency of disturbance is increased.

The disturb refresh operation will now be described with reference to the timing chart representing the disturb refresh operation shown in FIG. 15.

At the rising edge of clock signal CLK in clock cycle #0, chip select signal /CS, row address strobe signal /RAS, column address strobe signal /CAS and write enable signal /WE are each set to a low level and address signal AD is set to a specific state. A command mode-setting is applied and the disturb refresh test mode is designated. Disturb refresh test is identified simply by the state of a specific address signal bit. The command for setting a mode causes mode-setting indicating signal MS to attain an active high level setting all banks into a state that they are operable simultaneously. The mode setting allows entering the disturb refresh test.

In clock cycle #1, chip select signal /CS and row address strobe signal /RAS are each set to a low level at the rising edge of clock signal CLK. According to this active command, the current address signal AD is taken as row address signal X0, and a predetermined number of word lines are driven simultaneously to an active state in all banks. In this state, bank address signal BA is ignored.

According to the active command in clock cycle #1, word lines are selected, the row-related circuitry operates, and the sensing and amplification operation by sense amplifier is completed. Then chip select signal /CS, row address strobe signal /RAS and write enable signal /WE are each set to a low level and column address strobe /CAS is set to a high level to apply a precharge command in clock cycle #2. The precharge command causes all banks to return to a precharge state regardless of the states of address signal AD and bank address signal BA.

When the RAS precharge cycle elapses, an active command is again applied in clock cycle #3. When the active command is applied, with the current address signal AD as row address signal X1, the next word-line select operation is performed. Thereafter, alternate application of active and precharge commands is repeated by a predetermined disturbance frequency (i.e., the number of times of word line selection).

In clock cycle #m, a precharge command is applied to drive the last word line to a non-selected state and a disturb refresh operation is thus completed. When the disturb refresh operation is completed, data is then read for testing whether the data of memory cells are held accurately. Accordingly, the disturb refresh test mode has to be reset and thus chip select signal /CS, row address strobe signal /RAS, column address strobe signal /CAS and write enable signal /WE are each set again to a low level and address signal AD is set to a predetermined state. Here, the logic state of a bit of the address signal is made different from that of the address signal when the mode-setting command is applied. Mode-setting indicating signal MS attains an inactive low level to complete a simultaneous operation of a plurality of banks as well as the disturb refresh operation, and the mode of operation for increasing the number of word lines to be selected is reset.

As shown in FIG. 15, since mode-setting indicating signal MS is driven to an active state in disturb refresh testing, a disturb refresh operation can be performed simultaneously in a plurality of banks (i.e., four banks), and the frequency of disturb refresh can be increased (for a same disturb refresh time) or the time required for disturb refresh can be decreased (for a same frequency of disturb refresh).

Although sub arrays SA0–SA7 each have word line WL driven to selected state in the configuration shown in FIG. 14B, the number of word lines simultaneously driven to selected state in the disturb refresh operation has only to be larger than the number of word lines selected in the normal mode of operation. Furthermore, a plurality of word lines may be simultaneously driven to selected state in a single subarray in writing the same data into memory cells in the single subarray. Such operation can be achieved simply by degenerating, e.g., at least significant address signal bit of address signal bits for specifying subarrays and that of address signal bits for specifying word lines (i.e., by setting both of an address signal bit and the complementary address signal bit to selected state).

Configuration of Column-Related Drive/Control Circuit

Figure 16:
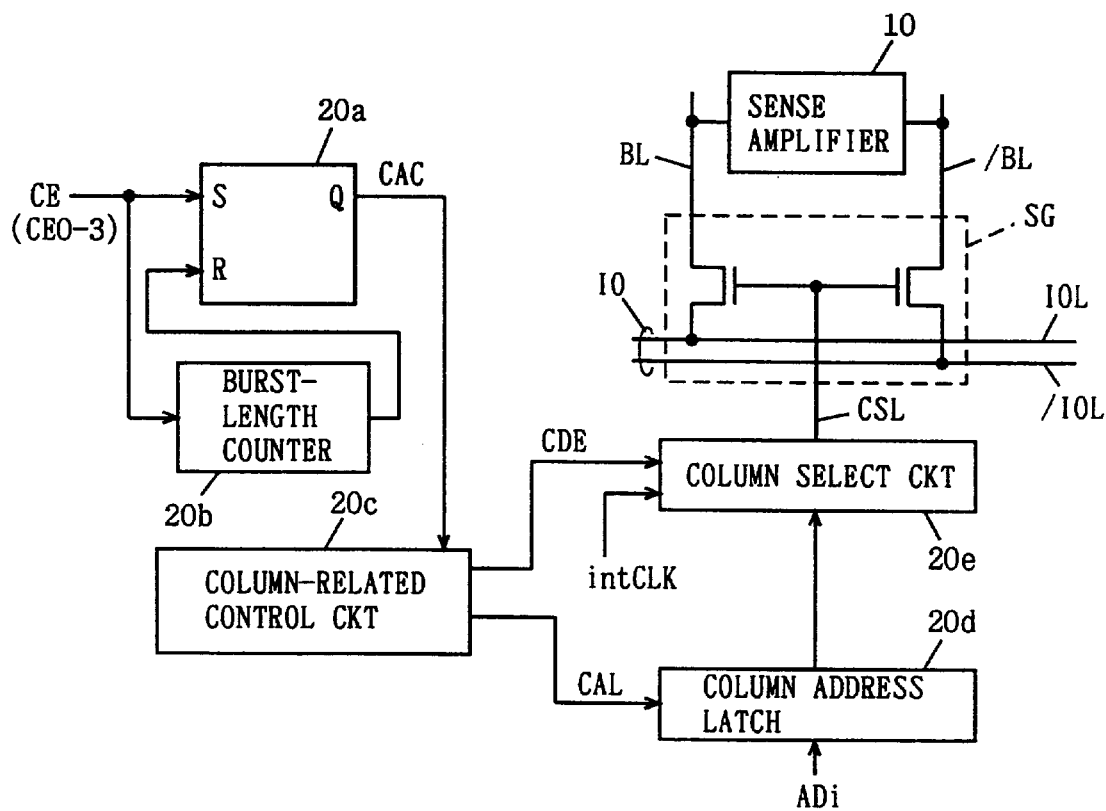
FIG. 16 schematically shows a configuration of column-related circuitry of a semiconductor memory device implemented according to the present invention.

FIG. 16 shows a configuration of a column-related drive control circuit of the bank control drive circuit for a single bank. The column-related drive control circuit shown in FIG. 16 includes: a set/reset flipflop 20a which is set in response to activation of column-related activating signal CE (CE0–CE3), to output a read/write activating signal CAC at an output Q; a burst-length counter 20b which delays read/write activating signal CAC for a period of a burst length; and a column-related control circuit 20c which controls an operation of column-related circuitry (a circuit related to selecting a column and a circuit related to writing/reading data) according to the activation of read/write activating signal CAC.

When burst-length counter 20b counts up the period of the burst length, burst-length counter 20b sets an output signal thereof to an active state to drive set/reset flipflop 20a to a reset state. Burst-length counter 20b has its countering operation reset when burst-length counter 20b receives column-related activating signal CE. Accordingly, if column-related activating signal CE is applied for each period of the burst length, the output signal from burst-length counter 20b is maintained in reset state and read/write activating signal CAC is responsively maintained in active state. Burst-length counter 20b is normally constituted by a shift circuit which shifts column-related activating signal CE in synchronization with internal clock signal intCLK.

Column-related control circuit 20c is synchronized with the internal clock signal when read/write activating signal CAC is activated to generate control signals required for selecting a column and writing/reading internal data in a predetermined sequence.

The column-related drive control circuit further includes: a column address latch 20d which is responsive to a column address latch designating signal CAL from column-related control circuit 20c, for taking and latching internal address signal ADi applied from the address input buffer; and a column select circuit 20e which is responsive to a column decode enable signal CDE from column-related control circuit 20c and internal clock signal intCLK, for generating a column address in a predetermined sequence with a column address signal applied from column address latch 20d as a head address, decoding the generated column address and driving the corresponding column to a selected state. Accordingly, column select circuit 20e includes: an address generating circuit which latches an internal column address signal from column address latch 20d and modifies the latched address according to internal clock signal intCLK in a predetermined sequence; and a column decoder which is responsive to column decode enable signal CDE for decoding an address signal from the address generating circuit and generating a column select signal.

The column select signal from column select circuit 20e is transmitted onto a column select line CSL connected to a column select gate SG provided for bit lines BL and /BL. Column select gate SG conducts when a signal on a corresponding column select line CSL attains an active high level, and thus electrically connects bit lines BL and /BL to internal data lines IO and /IO. FIG. 16 shows sense amplifier 10 only, although bit lines BL and /BL are connected to one column of memory cells.

Figure 17:
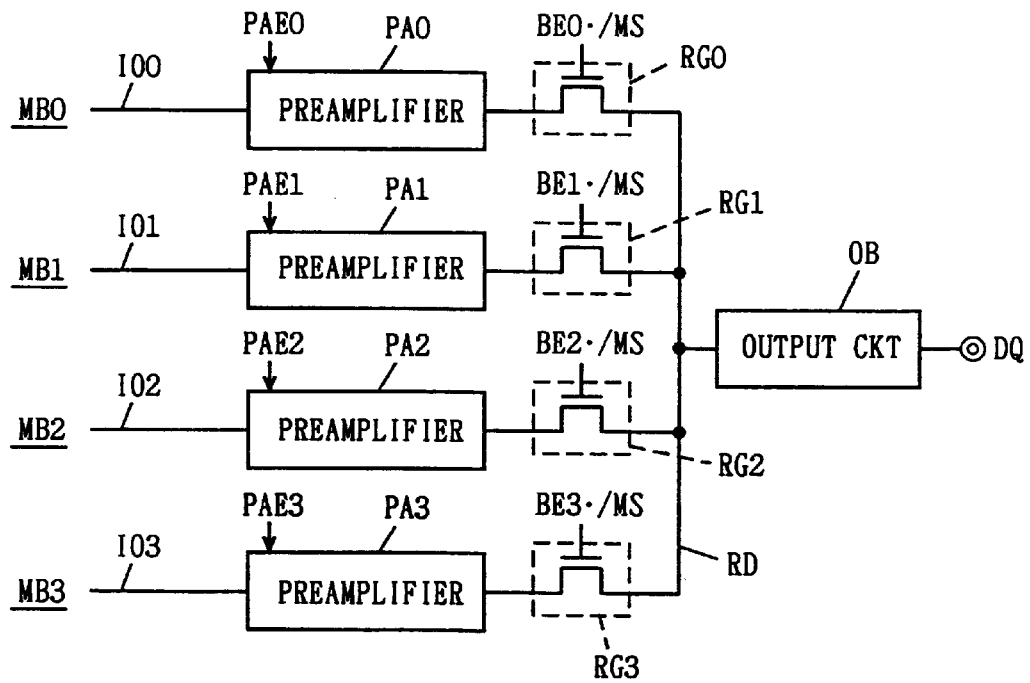
FIG. 17 schematically shows a configuration of a data reading portion of a semiconductor memory device implemented according to the present invention.

FIG. 17 schematically shows a configuration of a data output portion for banks MB0–MB3. In FIG. 17, respective banks MB0–MB3 are provided with internal data buses IO0–IO3 which in turn are provided with respective preamplifiers PA0–PA3. Output signals from preamplifiers PA0–PA3 are transmitted to a read data bus RD via read gates RG0–RG3, respectively. The data on read data bus RD is amplified by an output circuit (a main amplifier) OB to generate output data.

Read gate RG0 conducts when bank activating signal BE0 and a signal /MS of the inverted version of mode-setting indicating signal MS both attain high level. Read gate RG1 conducts when bank activating signal BE1 and signal 1MS both attain high level. Read gate RG2 conducts when bank activating signal BE2 and signal /MS both attain high level. Read gate RG3 conducts when bank activating signal BE3 and signal /MS both attain high level. In other words, read gates RG0–RG3 each do not conduct when mode-setting indicating signal MS attains a high level, and read gates RG0–RG3 are selectively driven to active state in response to bank activating signals BE0–BE3 in the normal mode of operation. Bank activating signals BE0–BE3 are generated according to column-related activating signals CE0–CE3.

Figure 18:
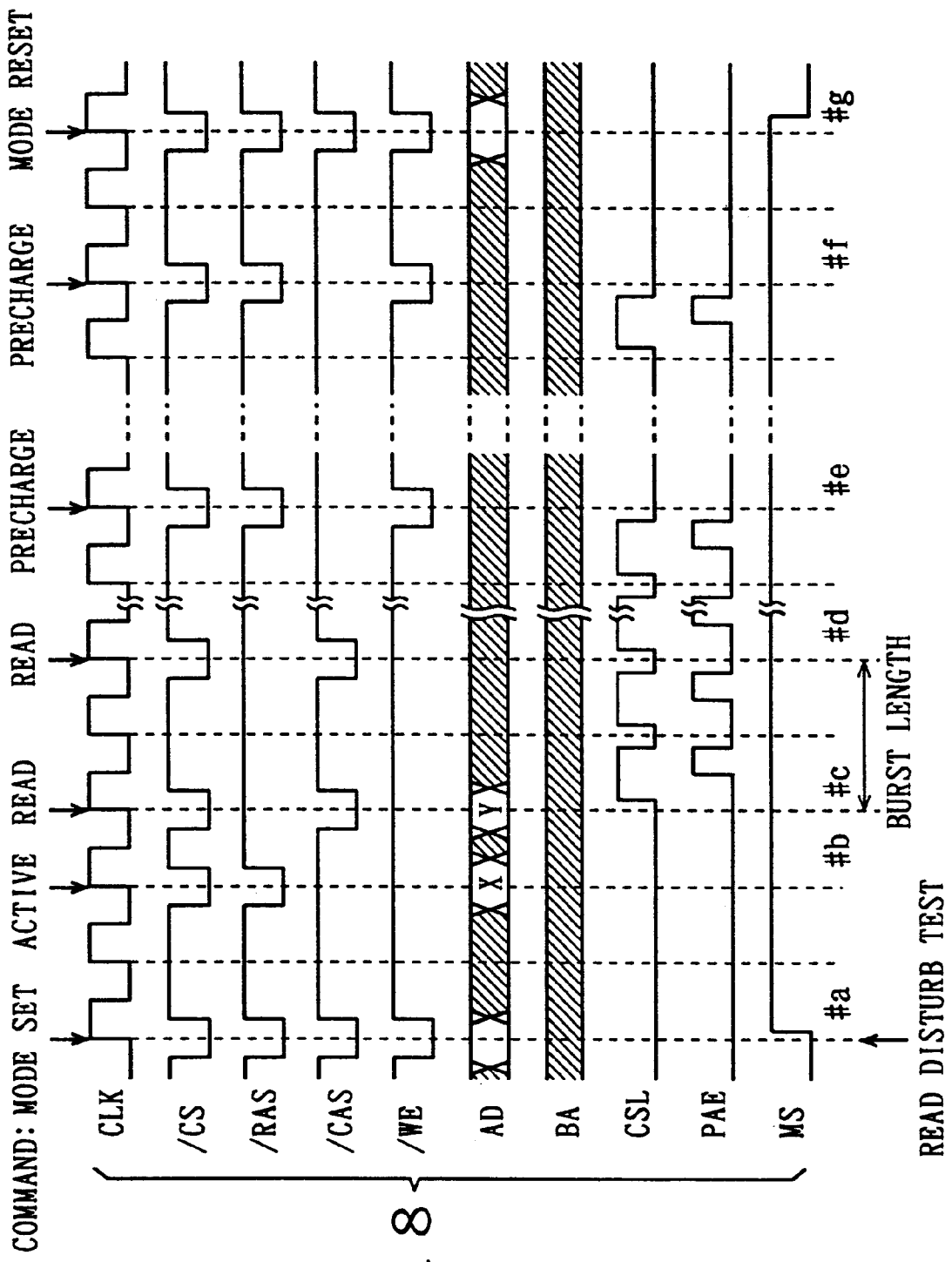
FIG. 18 is a timing chart for representing an operation of the semiconductor memory device as shown in FIGS. 16 and 17 in read disturb testing.

Operations of the circuits shown in FIGS. 16 and 17 will now be described with reference to the timing chart shown in FIG. 18.

Initially, signals /CS, /RAS, /CAS, and /WE are each set to a low level and address signal AD is set to a predetermined state in clock cycle #a. The disturb read mode is thus set and mode-setting indicating signal MS is driven to an active high level.

When the testing mode is set, signals /CS and /RAS are each set to a low level and signals /CAS, and /WE are each set to a high level in clock cycle #b and thus an active command is applied. Thus, each bank has a predetermined number of word lines driven to selected state.

When each bank has the word lines driven to the selected state and the data of selected memory cells are completely latched by sense amplifier, signals /CS and /CAS are each set to a low level and signals /RAS and /WE are each set to a high level in clock cycle #b and thus read command is applied. When the read command is applied, with the current address signal AD as a column address Y, a column select operation is performed in each bank. More specifically, set/reset flipflop 20a shown in FIG. 16 is set, read/write activating signal CAC is driven to an active state, and column select circuit 20e operates under control of column-related control circuit 20c to raise the potential on a column select line CSL to a high level according to the applied address signal. Then, the selection of the column select line CSL causes column select gate SG to conduct, the corresponding bit lines BL and /BL are connected to the pair of internal data lines IO, and the data latched in sense amplifier 10 is read onto the internal data bus.

Then, preamplifier activating signal PAE is activated and preamplifiers PA0–PA3 shown in FIG. 17 operate to amplify the data read onto internal data buses IO0–IO3. However, the data will not be read externally , since read gates RG0–RG3 are in non-conducting state. Conflict of data on internal common read data bus RD can thus be prevented.

When a read command is applied in clock cycle #c, burst addresses are generated in a predetermined sequence with column address Y as the head address and column select operations are successively performed under control of column-related control circuit 20c.

When the period of the burst length elapses, a read command is again applied in clock cycle #d and column select operation is repeated.

When the operations of selecting all of the columns are completed, signals /CS, /RAS and /WE are each set to a low level and signal /CAS is set to a high level in clock cycle #e and thus a precharge command is applied. Thus, selected word lines in all of the banks are returned to non-selected state. Thereafter, the operation is repeated that an active command is applied to drive word lines to selected state and then column select operation is performed. This simply allows internal column select operation and internal read out of data of a memory cell. This testing mode is referred to as the read disturb testing mode. Insulation failure, such as short circuit between the storage node of the capacitor of a memory cell and a bit line is detected by repeating the column select operation, which will be described later.

When read disturb testing is completed for all of memory cells, a precharge command is applied in clock cycle #f, the memory arrays of all banks are inactivated and the read disturb testing is completed.

Then, in clock cycle #g, signals /CS, /RAS, /CAS and /WE are each set to a low level and address signal AD is set to a specific state, to reset the read disturb test. Thus, mode-setting indicating signal MS attains an inactive low level, the read disturb test is reset and a following mode of operation can be designated.

Figure 19:
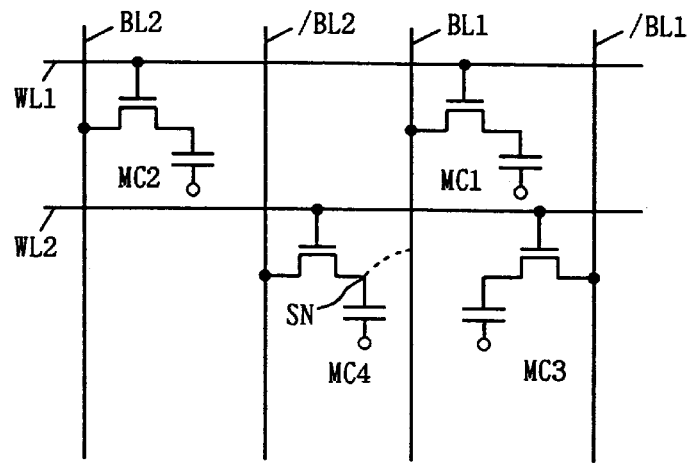
FIG. 19 is a diagram for explaining the read disturb testing.

FIG. 19 is a diagram for explaining the read disturb test. FIG. 19 shows word lines WL1 and WL2, and a pair of bit lines BL1 and /BL1 and another pair of BL2 and /BL2. A memory cell MC1 is arranged at the intersection of word line WL1 and bit line BL1, a memory cell MC2 at the intersection of word line WL1 and bit line BL2, a memory cell MC3 at the intersection of word line WL2 and bit line /BL1, and a memory cell MC4 at the intersection of word line WL2 and bit line /BL2.

It is assumed that word line WL1 is in selected state and that bit lines BL1 and /BL1 are selected and connected to the internal data bus. When word line WL1 is selected, the potential of bit line BL1 attains the potential level corresponding to the data stored in memory cell MC1 and the potential of bit line BL2 attains the potential level corresponding to the data stored in memory cell MC2. The potentials of bit lines BL1 and /BL1 are latched by a sense amplifier (not shown) and so are the potentials of bit lines BL2 and /BL2. It is assumed that the same data is written in memory cells MC1–MC4 and that there is a weak leakage due to short circuit or insulation failure between the storage node SN of memory cell MC4 and bit line BL1. When bit lines BL1 and /BL1 are selected and connected to the internal data bus in this state, the potentials of bit lines BL1 and /BL1 vary upon the connection to the bus and then are returned to the original voltage levels by the sense amplifier. In the connection to the bus, electric charge moves between storage node SN4 of memory cell MC4 and bit line BL1 and the amount of electric charge stored in memory cell MC4 varies. By successively repeating the selection of pairs of bit lines, the amount of electric charge stored in the capacitor of a non-selected, defective memory cell changes in a column select operation even when each memory cell has the same data, and the presence of a defective memory cell can thus be detected. This testing mode is referred to as the read disturb testing.

Figure 20:
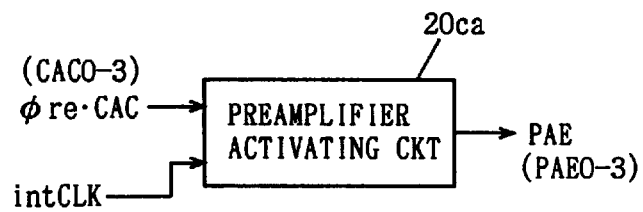
FIG. 20 schematically shows a configuration of circuitry for activating a preamplifier shown in FIG. 17.

FIG. 20 schematically shows a configuration of a preamplifier activating signal generating circuit. A preamplifier activating circuit 20ca shown in FIG. 20 is included in column-related control circuit 20c shown in FIG. 16 and outputs a preamplifier activating signal PAE in response to the AND signal of read/write activating signal CAC and read activating signal φre and to internal clock signal intCLK. Preamplifier activating circuit 20c a is provided in each bank, and the activating signals CAC and PAE represent the activating signals CAC0–CAC3 and PAE0–PAE3 generated in each bank. Read activating signal φre is activated when a read command is applied.

Another Configuration of the Array

Figure 21:
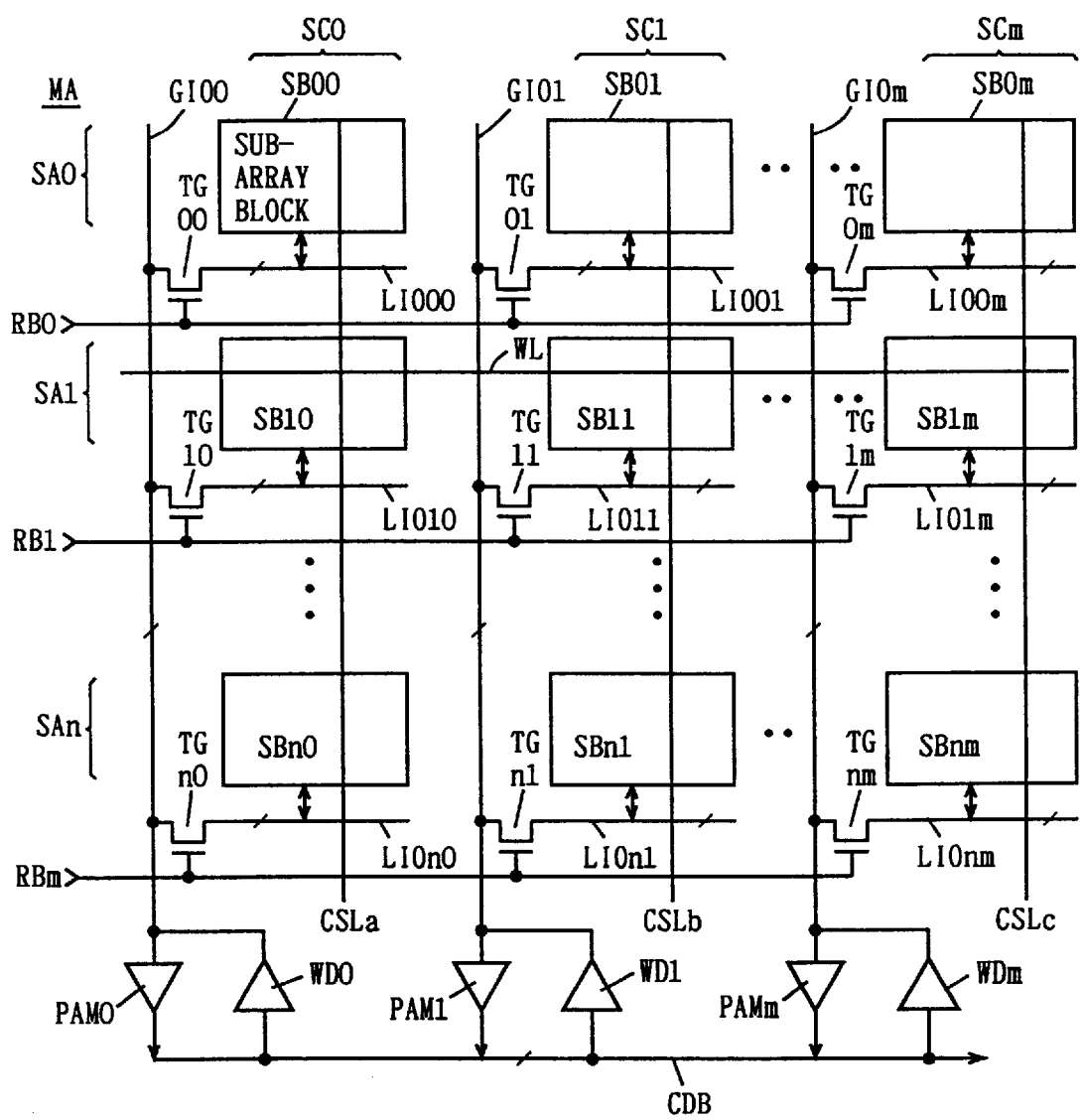
FIG. 21 schematically shows another configuration of the memory array of the semiconductor memory device configured according to the present invention.

FIG. 21 shows another configuration of a memory array of a semiconductor memory device as an implementation of the present invention. FIG. 21 shows a configuration of a memory array for a single memory bank. The memory array shown in FIG. 21 is provided for each bank. In FIG. 21, memory array MA includes a plurality of subarray blocks SB00–SBnm arranged in the row and column directions. Subarray blocks SB00–SBnm each have a plurality of memory cells arranged in a matrix. Subarray blocks arranged in a row form a single subarray. For example, subarray blocks SB00–SB0m form a subarray SA0. FIG. 21 shows an arrangement of subarrays SA0–SAn. The subarray blocks included in a same subarray are provided with a common word line WL. FIG. 21 shows subarray blocks SB10–SB1m included in subarray SA1 are provided with a common word line WL.

Subarray blocks arranged in the column direction forms a column block. FIG. 21 shows column blocks SC0–SCm. For example, subarray blocks SB00–SBn0 form column block SC0. The subarray blocks included in a single column block are provided with a common column select line CSL. FIG. 21 representatively shows column select lines CSLa, CSLb and CSLc for column blocks SC0, SC1 and SCm, respectively. Column select lines CSLa–CSLc transmit the column select signals from column select circuit 20e shown in FIG. 16.

Subarray blocks SB00–SBnm are respectively provided with local data buses LIO00–LIOnm which in turn provide data communication only with the corresponding subarray blocks. Column blocks SC0–SCm are provided with global data buses GIO0–GIOm which in turn provide data communication only with the corresponding column blocks. For example, global data bus GIO0 provides data communication only with subarray blocks SB00–SBn0 included in column block SC0.

Block select gates TG00–TGnm are provided for connecting local data buses LIO00–LIOnm to the corresponding global data buses GIO0–GIOm. Block select gates TG00–TGnm, connected between local data buses LIO00–LIOnm and corresponding global data buses GIO0–GIOm, selectively conduct in response to array select signals RB0–RBn to electrically connect corresponding local data buses to corresponding global data buses.

Array select signals RB0–RBn select subarrays SA0–SAn respectively and connect the local data buses provided for a selected subarray to the global data buses. For example, array select signal RB0 for subarray SA0 is commonly applied to block select gates TG00–TG0m provided for local data buses LIO00–LIO0m. Similarly, array select signal RB1 for subarray SA1 is commonly applied to block select gates TG10–TG1m provided for local data buses LIO10–LIO1m. Also, array select signal RBn for subarray SAn is commonly applied to block select gates TGn0–TGnm provided for local data buses LIOn0–LIOnm. Thus, in the normal mode of operation, a single array select signal is driven to an active state to electrically connect the subarray blocks included in a single subarray to global data buses GIO0–GIOm, provided that the bus width of the local data buses is equal to that of the global data buses.

Global data buses GIO0–GIOm are provided with preamplifier circuits PAM0–PAMm respectively which in turn are activated in reading data, to amplify and transmit the data on the respective global data buses to a common data bus CDB, and writing drivers WD0–WDm which amplify the write data on the common data bus CDB in writing data and transmit the amplified data to the respective global data buses. The common data bus CDB is connected to the data input/output circuit provided commonly for banks MB0–MB3.

The bit width of each of global data buses GIO0–GIOm is the same as that of each of local data buses LIO00–LIOnm, provided that only one subarray is selected. The bus width of a global data bus is larger than that of a local data bus of two subarrays are selected from subarrays SA0–SAn and the local data buses provided for the simultaneously selected subarrays are connected to different bus lines of each respective global data bus.

The bus width of the common data bus CDB may or may not be the same as the bus width of global data buses GIO0–GIOm. If the bus width of the common data bus CDB is different from that of a total of global data buses GIO0–GIOm, preamplifier circuits PA0–PAm or writing drivers WD0–WDm are selectively activated (in response to column address). Thus, data of multiple bits are transmitted between the common data bus CDB and the global data buses.

In order to avoid data conflict in the normal mode of operation in the configuration of the memory array shown in FIG. 21, global data buses GIO0–GIOm and local data buses LIO00–LIOnm are electrically connected according to block select signals RB0–RBm.

In the disturb refresh operation, word lines in subarrays SA0–SAn are simultaneously driven to selected state. In this state, however, electrical connection between local data bus and global data bus would not cause any problems, since word lines are only driven successively to selected state and column select operation is not performed in disturb refreshing. Column selection is, however, performed in conducting read disturb testing. If the number of subarrays selected in read disturb testing is larger than that of subarrays selected in the normal mode of operation, a plurality of local data buses are connected to a same global data bus and data conflict is caused. Therefore, in conducting read disturb testing, array select signals RB0–RBm are set to inactive state to provide electrical disconnection between global data buses GIO0–GIOm and local data buses LIO00–LIOnm. Thus, the data latched by sense amplifiers in subarray blocks SB00–SBnm are merely transmitted onto the respective local data buses LIO00–LIOnm. In this case also, column select lines CSL are successively driven to selected state and thus read disturb testing can be satisfactorily conducted.

Figure 22:
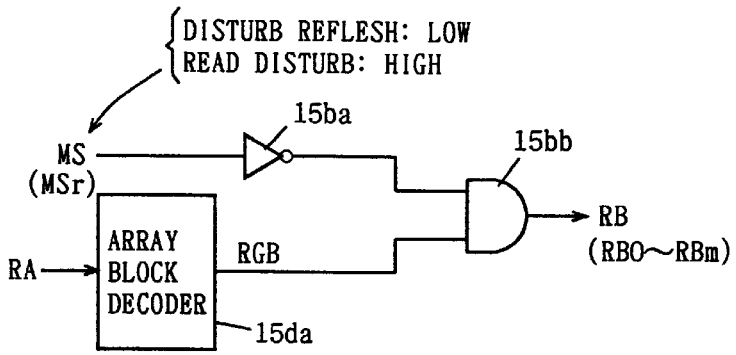
FIG. 22 schematically shows a configuration of the sub-array select signal generating portion shown in FIG. 21.

FIG. 22 shows a configuration of a block select signal generating unit. Referring to FIG. 22, the block select signal generating unit includes: an array block decoder 15da which decodes a subarray address RA specifying a subarray in an internal row address from row address latch 15c, and outputs a subarray specifying signal RGB; an inverter 15ba which receives mode-setting indicating signal MS; and an AND circuit 15bb which receives an output signal of inverter 15ba and subarray specifying signal RGB from array block decoder 15da to output a subarray select signal RB.

Array block decoder 15da is included in row select circuit 15d shown in FIG. 11, and inverter circuit 15ba and AND circuit 15bb are included in row-related control circuit 15b. The mode-setting indicating signal MS is set to low level in the disturb refresh mode, in which more word lines are driven to selected state and successively selected than in the normal mode of operation and mode-setting indicating signal MS is set to high level in read disturb testing and column select lines CSL are successively selected. In the disturb refresh mode and in read disturb testing, the mode-setting indicating signal MS for banks is in active state and the banks are all activated simultaneously. In the following description, a reference character MSr represents the mode-setting indicating signal MS for designating read disturb testing, and a reference character MSd represents the mode-setting indicating signal MS for the disturb refresh testing.

In conducting the read disturb testing according to the configuration of the subarray select signal generating unit shown in FIG. 22, mode-setting indicating signal MSr attains a high level, the output signal from inverter 15ba attains a low level, subarray select signal RB from AND circuit 15bb attains a low level, block select gates TG00–TGnm shown in FIG. 21 are all set to off state, and global data buses GIO0–GIOm and local data buses LIO00–LIOnm are all disconnected electrically. Accordingly, even when a bit line is driven to selected state in each subarray, data conflict will not be caused on the global data buses and thus read disturb testing can be accurately conducted.

Meanwhile, subarray select signal RB may also be set to low level in disturb refresh testing.

Figure 23:
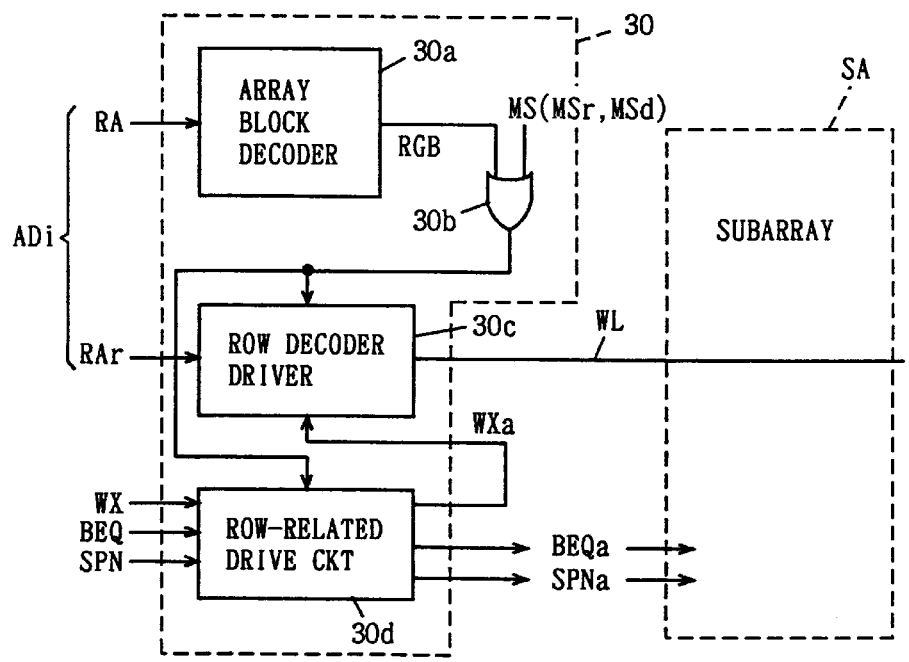
FIG. 23 schematically shows a configuration of a row-related control drive circuit for the memory array shown in FIG. 21.

FIG. 23 schematically shows a configuration of a row select circuit for a single subarray SA. A row select circuit 30 shown in FIG. 23 receives sense amplifier activating signal SPN, bit-line equalization designating signal BEQ and word-line drive signal WX and controls the activation/inactivation of the corresponding subarray, with row-related control circuit 15b shown in FIG. 11 as a master control circuit.

In FIG. 23, row select circuit 30 includes: an array block decoder 30a which decodes subarray address signal RA to output subarray specifying signal RGB; an OR gate 30b which receives subarray specifying signal RGB output from array block decoder 30a and mode-setting indicating signal MS; a row decode driver 30c which is activated when an output signal from OR gate 30b is activated, to decode an applied word-line address signal RAr and drive a corresponding word line WL to a selected state; and a row-related drive circuit 30d which is activated when the output signal from OR gate 30b is activated, to be responsive to word-line drive signal WX, bit-line equalization designating signal BEQ and sense amplifier activating signal SPN for outputting a word-line drive signal WXa, a bit-line equalization designating signal BEQa and a sense amplifier activating signal SPNa for a corresponding subarray. Word-line drive signal WXa from row-related drive circuit 30d is applied to row decode driver 30c. Bit-line equalization designating signal BEQa and sense amplifier activating signal SPNa are applied to bit-line precharger equalize circuit and sense amplifier included in subarray SA.

Row select circuit 30 shown in FIG. 23 is provided for each subarray to control the activation/inactivation of each subaray SA.

When mode-setting indicating signal MS attains an inactive low level, the output signal from OR gate 30b changes according to subarray specifying signal RGB from array block decoder 30a. When a corresponding subarray SA is specified, row decode driver 30c and row-related drive circuit 30d are activated and the corresponding subarray SA is activated/inactivated.

When mode-setting indicating signal MS is activated, the output signal from OR gate 30b attains an active high level regardless of the state of subarray specifying signal RGB from array block decoder 30a and row decoder driver 30c and row-related drive circuit 30d are activated. Thus, all subarrays SA in a memory array are activated/inactivated. Thus, disturb refreshing can be simultaneously performed in all subarrays of the memory array. The use of the configuration shown in FIG. 23 also allows disturb refreshing and read disturb testing to be performed simultaneously.

The mode-setting indicating signal MS shown in FIG. 23 is generated from the OR of mode-setting indicating signal MSr activated in the read disturb mode and mode-setting indicating signal MSd activated when the disturb refresh mode is designated, and is set to active state in the both modes.

Thus, disturb refreshing and read disturb testing can be done simultaneously, and testing time can thus be reduced.

Especially, since these testing can be performed simultaneously in all banks, testing time can further be reduced.

Second Modification of the Memory Array

Figure 24:
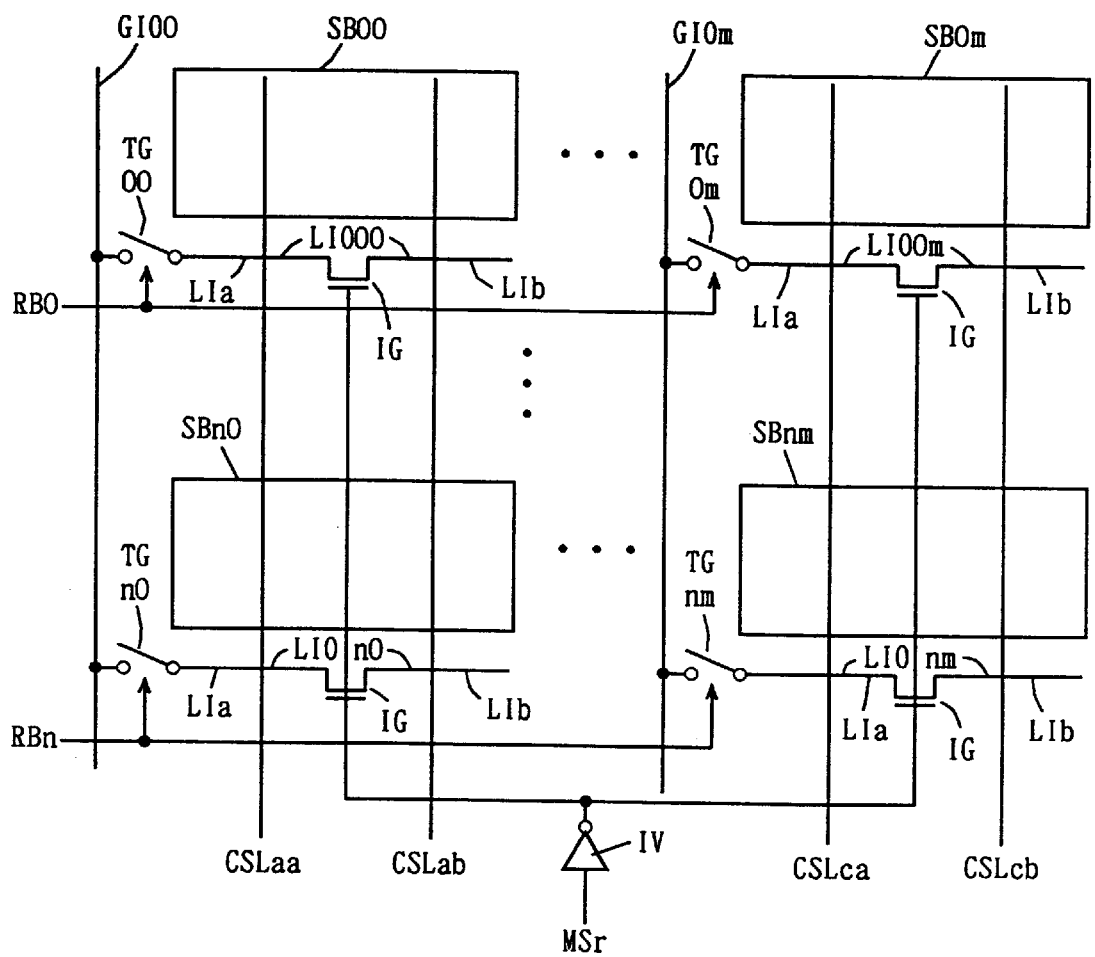
FIG. 24 shows a connection manner of an internal data bus of the memory array shown in FIG. 21 in read disturb testing.

FIG. 24 shows a configuration of a second modification of the memory array. In FIG. 24, subarray blocks SB00–SB*nm* are provided respectively with local data buses LIO00–LIO*nm* each provided with an isolation gate IG, which in turn is set to an off state when mode-setting indicating signal MS*r* from an inverter IV attains a low level. When isolation gate IG is set to an off state, local data buses LIO00–LIO*nm* are each divided into two sub local data buses LI*a* and LI*b*.

Mode-setting indicating signal MS*r* attains an active high level in the read disturb test mode, and local data buses LIO00–LIO*nm* are each divided into two segments in the read disturb testing by setting isolation gates IG to an off state. Block select gates TG00–TG*nm* are each in an off state, since subarray select signals RB0–RB*n* are all in inactive state. Accordingly, data conflict will not be caused in the read disturb testing even if sub local data buses LI*a* and LI*b* of local data buses LIO00–LIO*nm* simultaneously receive the data latched by sense amplifiers of the respective subarrays. Accordingly, in the read disturb testing, two column select lines CSL*aa* and CSL*ab* are simultaneously driven to a selected state in each subarray block and sub local data buses LI*a* and LI*b* of local data buses LIO00–LIO*nm* receive data, reducing read disturb testing time. Since block select gates TG00–TG*nm* are also all in off state (see FIG. 22), data conflict will not be caused on global data buses GIO0–GIO*m* and thus read disturb testing can be conducted accurately.

Figure 25:
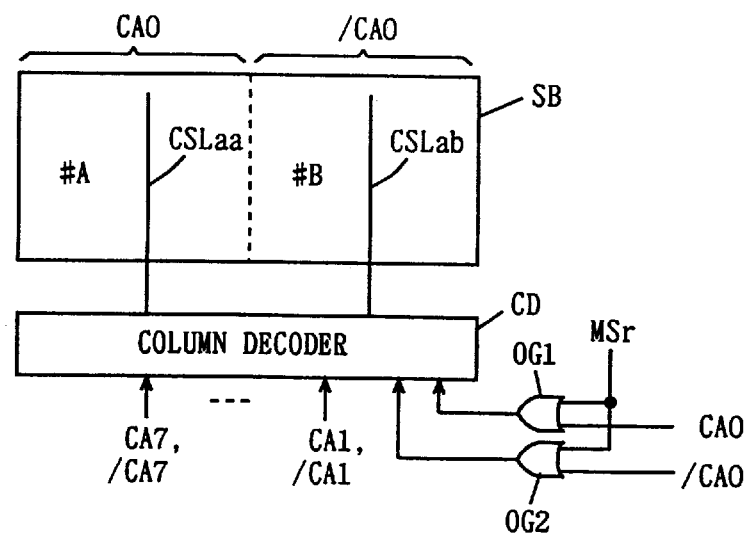
FIG. 25 schematically shows a configuration for implementing the column selecting manner shown in FIG. 24.

FIG. 25 shows a configuration for driving the column select lines shown in FIG. 24. A subarray block SB shown in FIG. 25 is divided into two regions #A and #B. Region #A is selected when a column address signal bit CA0 attains high level. Region #B is selected when a complementary column address signal bit /CA0 attains high level. A column decoder CD decodes applied column address signal bits CA0, /CA0 to CA7, /CA7 to drive a column select line corresponding to an addressed column to a selected state.

Column decoder CD is provided with an OR gate OG1 which receives column address signal bit CA0 and mode-setting indicating signal MS*r*, and an OR gate OG2 which receives column address signal bit /CA0 and mode-setting indicating signal MS*r*. When mode-setting indicating signal MS*r* attains an inactive low level, column decoder CD transparently receives column address signal bits CA0 and /CA0. When mode-setting indicating signal MS*r* attains a high level, column address signal bits CA0 and /CA0 both attain high level to be applied to column decoder CD. In this state, column select lines CSL*a* and CSL*b* are simultaneously driven to selected state in the respective regions #A and #B of subarray block SB.

Since a predetermined column address signal bit is set to state (bits CA0 and /CA0 are both set to selected degenerated state of high level) according to mode-setting indicating signal MS*r*, as shown in FIG. 25, the required number of column select lines can readily be simultaneously driven to selected state.

Configuration of Data Read Unit

Figure 26:
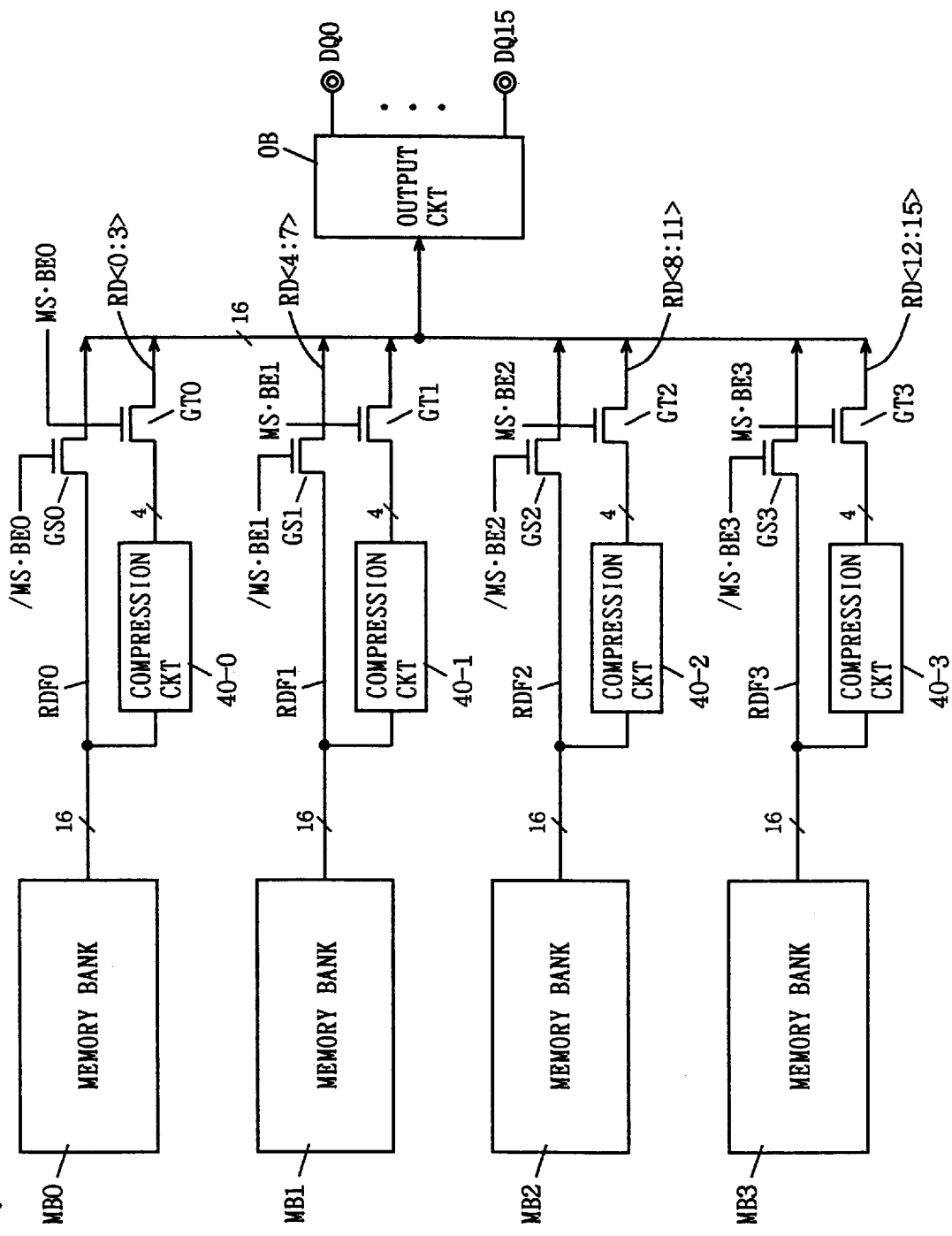
FIG. 26 schematically shows a configuration of a data reading portion of a semiconductor memory device configured according to the present invention.

FIG. 26 schematically shows a configuration of the data read portion of a semiconductor memory device as an implementation of the present invention. In FIG. 26, data read from memory cells selected in memory banks MB0–MB3 are transmitted respectively onto bank read data buses RDF0–RDF3 each having a width of 16 bits. In other words, data of 16 bits is read from each of memory banks MB0–MB3. Bank read data buses RDF0–RDF3 each correspond to the common data bus CDB shown in FIG. 21.

Bank read data buses RDF0–RDF3 are respectively provided with compression circuits 40-0 to 40-3 for compressing applied data of 16 bits into data of four bits and outputting the compressed data. Compression circuits 40-0 to 40-3 each determine the coincidence/incoincidence in logic of the applied data and output a signal indicating the result of decision as compressed data.

Bank read data buses RDF0–RDF3 are coupled with a common read data bus RD via bank select gates GS0–GS3, respectively. When the AND of bank select signal BE0–BE3 and signal /MS of the inverted version of mode-setting indicating signal MS attains a high level, bank select gates GS0–GS3 conduct an electrically connect the respective bank read data buses RDF0–RDF3 to the common read data bus RD. Bank activating signals BE0–BE3 are generated according to column activating signals CE0–CE3 shown in FIG. 10, as will be described more specifically below. Thus, in the normal mode of operation, mode-setting indicating signal /MS is at an inactive high level and bank select gates GS0–GS3 are rendered conducting/non-conducting in response to bank activating signals BE0–BE3.

An output of each of compression circuits 40-0 to 40-3 is coupled with a predetermined bus line of the common read data bus via the respective compressed data select gates GT0–GT3. Compressed data select gates GT0–GT3 conduct when mode-setting indicating signal MS is activated, to transmit compressed data from the respective compression circuits 40-0 to 40-3 to the common read data bus RD.

4-bit data output from each of compression circuits 40-0 to 40-3 is transmitted to different data bus lines of common read data bus RD. More specifically, 4-bit data from compression circuit 40-0 is transmitted on 4-bit bus lines RD <0:3> of common data bus RD. 4-bit data from compression circuit 40-1 is transmitted on 4-bit data bus lines RD <4:7> of common read data bus RD. 4-bit data from compression circuit 40-2 is transmitted on bus lines RD <8:11> of common read data bus RD. 4-bit data output from compression circuit 40-3 is transmitted on bus lines RD <12:15> of common read data bus RD. When memory banks MB0–MB3 are all operated simultaneously to read data from memory cells in reading testing data, the compressed version of the data of memory cells selected from each bank can be transmitted on common read data bus RD without conflict.

Common read data bus RD is connected to an output circuit OB which in turn is activated to buffer the data on the 16-bit common read data bus RD and transmit the buffered data to data output terminals DQ0–DQ15.

Figure 27:
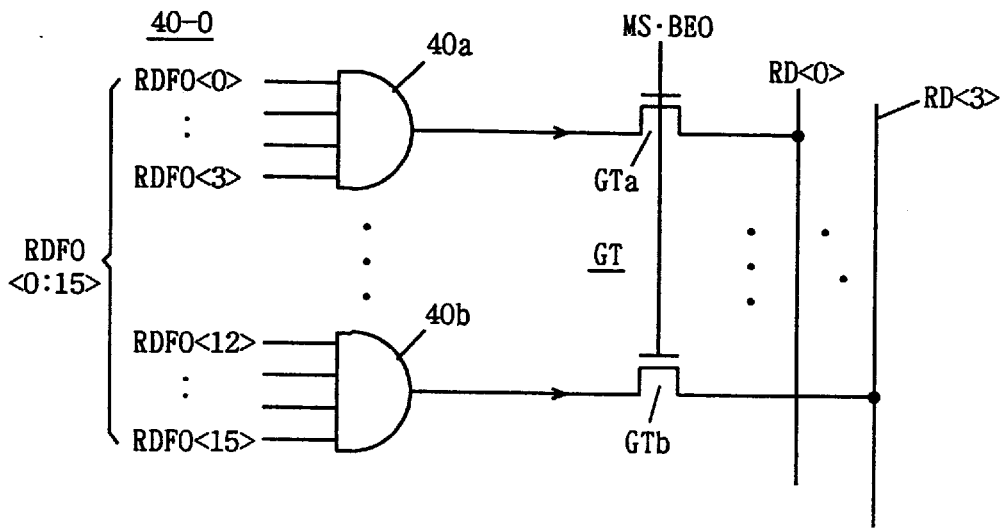
FIG. 27 schematically shows an example of the configuration of the degeneration circuit shown in FIG. 26.

FIG. 27 shows one example of the configuration of compression circuit 40-0 provided for memory bank MB0 shown in FIG. 26. Compression circuit 40-0 shown in FIG. 27 includes four AND circuits which receive signals on different 4-bit bus lines of bank read data bus RDF0 <0:15>. FIG. 27 shows an AND circuit 40*a* which receives data on 4-bit bus lines RDF0<0>–RDF0<3>, and an AND circuit 40*b* which receives data on bus lines RDF0<12>–RDF0<15>. The remaining 4-bit bus lines RDF0<4>–RDF0<7> and RDF0<8>–RDF0<11> are also provided with corresponding AND circuits. An output signal from AND circuit 40*a* is transmitted on common read data bus line RDF<0> via compressed-data select gate GT*a*. An output signal from AND circuit 40*b* is transmitted on a common read data bus line RD<3> via a compressed-data select gate GTb. Compression circuits 40-1 to 40-3 provided for the remaining memory banks MB1–MB3 have a similar configuration, and are provided with AND circuits each for compressing 4-bit data into 1-bit data and transmitting the output signal via a compressed-data select gate onto a different bus line of the common read data bus.

By transmitting the data from compression circuits 40-0 to 40-3 onto common read data bus lines RD<0>–RD<15>, as shown in FIG. 27, 4-bit data is compressed into 1-bit data and then transmitted on each of common read data bus line RD<0>–RD<15>.

Figure 28:
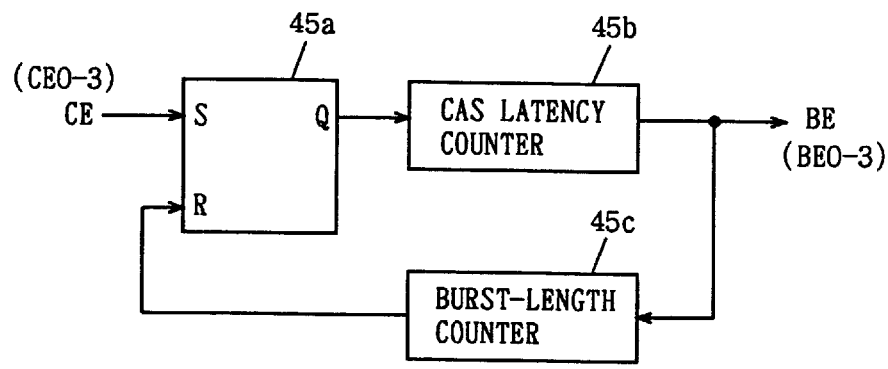
FIG. 28 schematically shows a configuration of a portion for generating a bank activating signal shown in FIG. 26.

FIG. 28 shows a configuration of a portion for generating bank activating signals BE0–BE3 for application to bank select gates GS0–GS3. The bank activating signal generating circuitry shown in FIG. 28 is provided for each bank, and may be included in or provided separately from the column-related control circuit shown in FIG. 16.

The bank activating signal generating circuitry shown in FIG. 28 includes: a flipflop 45a which is set when column-related activating signal CE is activated; a CAS latency counter 45b which is started in response to activation of an output signal from flipflop 45a for counting a clock cycle period of a CAS latency minus one cycle to output bank activating signal BE (BE0–BE3); and a burst-length counter 45c which is activated when bank activating signal BE from CAS latency counter 45b is activated, for counting the period of a burst length and applying a count-up signal to a reset input R of the set/reset flipflop.

CAS latency counter 45b and burst-length counter 45c are each constituted by a shift register, which in turn operates in synchronization with an internal clock signal and shifts an applied signal according to the clock signal for a predetermined period to generate an output signal. An operation of the bank activating signal generating circuitry shown in FIG. 28 will now be described with reference to the timing chart shown in FIG. 29.

Figure 29:
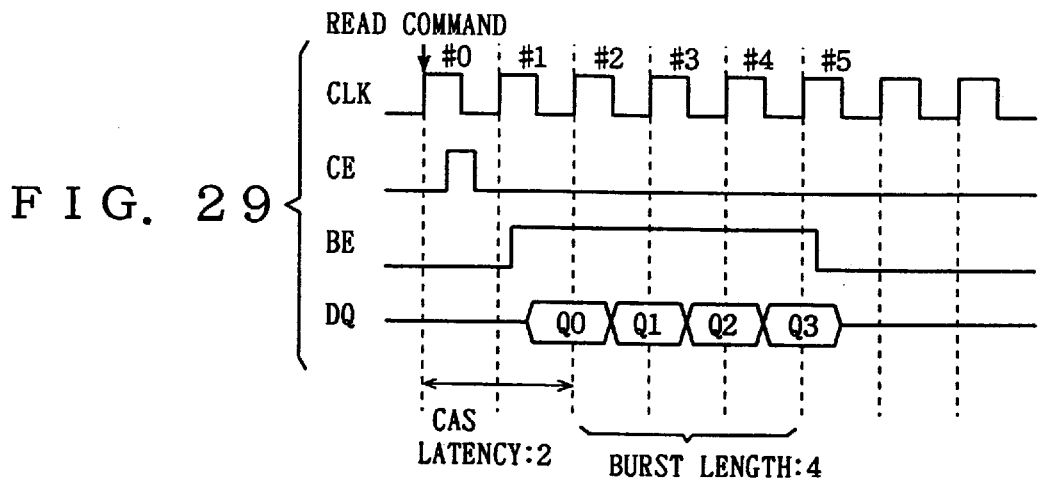
FIG. 29 is a timing chart for representing an operation of the circuitry shown in FIG. 28.

Referring to FIG. 29, a read command is applied in clock cycle #0 and column-related activating signal CE is activated for a predetermined period. Accordingly, set/reset flipflop 45a is set and a signal from an output Q thereof rises to a high level. CAS latency counter 45b delays an applied signal for the cycle period of a CAS latency minus one cycle. Assuming now that the CAS latency is two, bank activating signal BE from CAS latency counter 45b is activated and burst-length counter 45c is started in clock cycle #1. According to the activation of bank activating signal BE, a bank select gate conducts, read data is provided to the output circuit, and first read data Q0 is defined in clock cycle #2. Assuming now that the burst length is four, data Q1, Q2 and Q3 are provided to output circuit OB in clock cycles #3, #4, and #5, respectively, and defined at each respective rising edge of clock signal CLK.

Burst-length counter 45c counts the period of the burst length, i.e., the period of four clock cycles, the output signal is activated in clock cycle #4, and set/reset flipflop 45a is reset. The output signal from set/reset flipflop 45a is transmitted via CAS latency counter 45b. Thus, bank activating signal BE is inactivated in clock cycle #5.

The operation waveforms shown in FIG. 29 represent that the output circuit takes and output received data in a same clock cycle. However, if the output circuit includes a one-stage latch circuit and output taken data in the next cycle, the activation period of bank activating signal BE is changed accordingly.

By also applying bank activating signal BE (BE0–BE3) to compressed-data selected gate GT, data can be accurately read at precise timing according to a parameter of latency also in the test operation.

The configuration of the bank activating signal generating circuitry shown in FIG. 28 is also employed for generating bank activating signal BE0–BE3 shown in FIG. 17.

Figure 30:
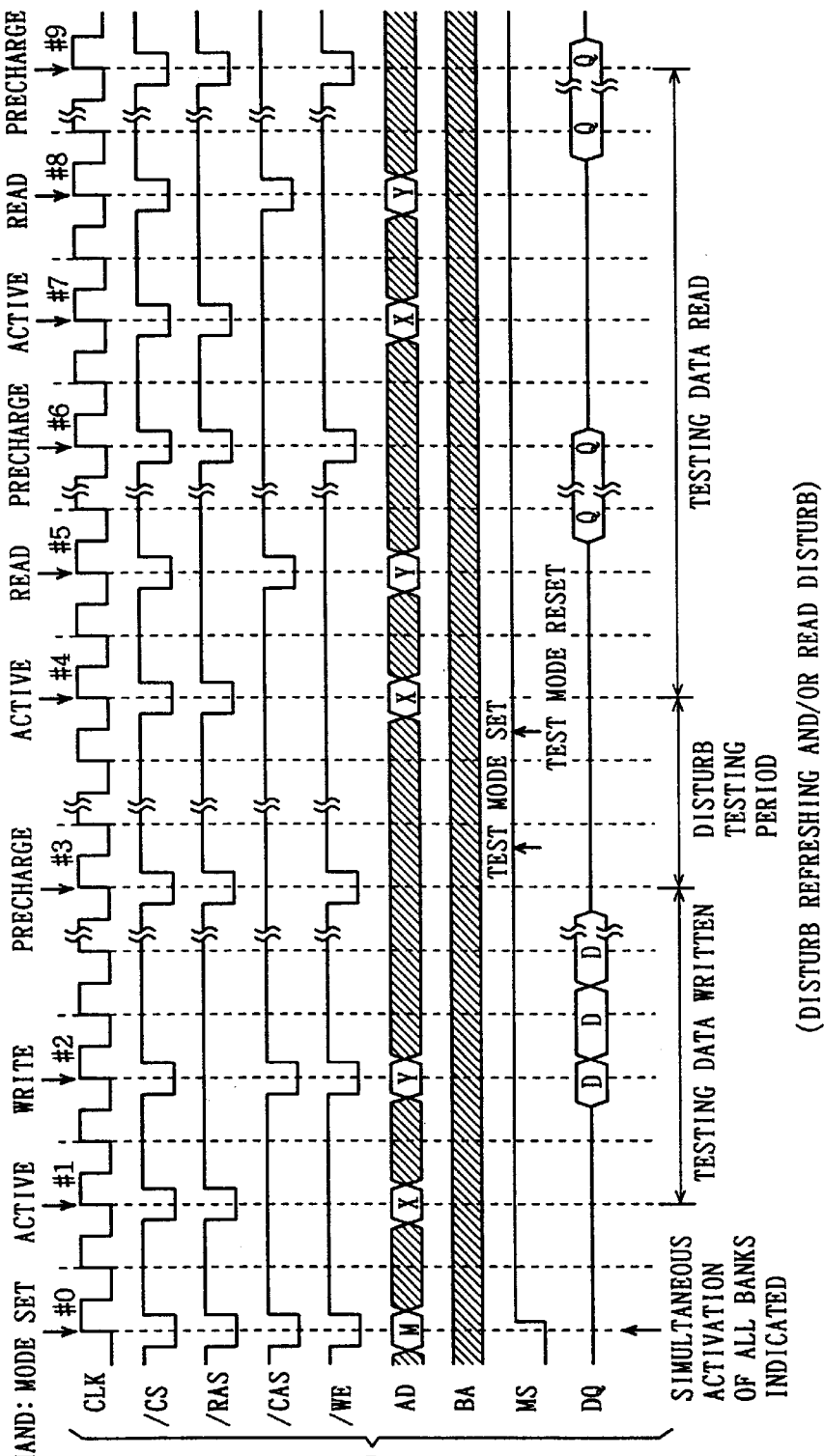
FIG. 30 is a timing chart for representing data read/write operations of a semiconductor memory device configured according to the present invention.

An operation of the semiconductor memory device shown in FIG. 26 will now be described with reference to the timing chart shown in FIG. 30.

A mode setting command is applied in clock cycle #0. The address signal AD when the mode setting command is applied is incorporated as a mode setting signal M to designate activating simultaneously all banks and also designate a test mode or whether disturb refreshing or read disturb testing is conducted. According to the mode setting command, mode-setting indicating signal MS attains an active high level to set a test mode.

Then, an active command is applied in clock cycle #1. Since mode-setting indicating signal MS has attained an active high level, with address signal AD as a row address signal, row select operation is performed in all banks. Bank address signals are all ignored and all banks are driven to active state.

Then, a write command is applied in clock cycle #2 and a column select operation is performed using the address signal AD when the write command is applied as a column address signal. The data D when the write command is applied and following data are successively written into memory cells in a predetermined sequence. When the testing data has been written into all of memory cells, a precharge command is applied in clock cycle #3 to complete the cycle for writing the testing data. The circuit for writing the testing data activates write drivers WD0–WDm shown in FIG. 21 in all banks to write the testing data. In writing the testing data, each of local data buses is not divided into two segments, as shown in FIG. 24.

Then, testing is conducted as required in and after clock cycle #3, and disturb refresh operation and/or read disturb testing are/is conducted. For conducting read disturb testing in the testing period, a new mode setting command is applied and each local data bus is divided into two segments to implement the configuration shown in FIG. 24.

Disturb refreshing and/or read disturb testing are/is conducted in all subarrays in all banks simultaneously, as has been described in the previous embodiments.

When the disturb testing period elapses, data is then read from memory cells.

In clock cycle #4, an active command is used and the current address signal AD is applied as row address signal X for row selection in all banks.

Then, in clock cycle #5, a read command is applied and with the current address signal AD as a column address signal a memory cell select operation is performed. According to the read command, memory cell data of 16 bits is read from each of memory banks MB0–MB3 shown in FIG. 26. Mode-setting indicating signal MS is in the high-level active state. Bank activating signals BE0–BE3 are in active state, since column-related activating signals CE0–CE3 are all in active state. Bank select gates GS0–GS3 are in non-conducting state. Meanwhile, compressed-data select gates GT0–GT3 are in conducting state. Compression circuits 40-0 to 40-3 each compress applied 16-bit data into 4-bit data and transmit the compressed data onto read data bus RD for output to the data input/output terminals DQ0–DQ15 via output circuit OB.

When such a compression circuit as described above is used and the output signal of each compression circuit is transmitted onto a different read data bus line, data can be accurately read without data conflict from memory cells of all banks. Thereafter, a read command is applied each time reading of burst-length data completes. When a page (i.e., a word line) is to be switched, a precharge command is applied in clock cycle #6 in order to once drive all banks to inactive state. Then, in clock cycle #7, an active command is applied and a new address signal AD is used as a row address signal column select operation is performed in all banks.

Then, in clock cycle #8, a read command is applied and the current address signal AD is incorporated as a column address signal and column select operation and reading data from memory cells are sequentially performed. Thereafter, the read operation is performed for the selected word line. When the data read operation for the memory cells of one row is completed, a precharge command is applied in clock cycle #9 to prepare for a next row select operation. This operation is repeated to read data from memory cells of all word lines and determine whether the data read from the memory cells are all coincident in logic. The coincidence/incoincidence in logic of the data read from memory cells can represent the memory cells as being normal or defective. Needless to say, the write data all have a same logic.

Data is written into/read from all banks simultaneously, although the number of word lines driven to selected state is smaller than in the disturb testing period. Accordingly, to activate word lines and column select lines more than those in writing and reading testing data in the disturb testing period, a setting for newly conducting the disturb testing is performed when a disturb testing period starts. This prevents a plurality of word lines and/or a plurality of column lines (pairs of bit lines) from being simultaneously set to select state in reading and writing testing data so that data conflict can be avoided. In writing testing data, however, a plurality of word lines may be simultaneously driven to selected state, as in disturb testing, if the write data has the same logic. However, the two segmentization of each local data bus and the isolation between the local data buses and the global data buses are set when the testing period is started, as a matter of course.

Since testing data is written into and read from all banks simultaneously, as described above, mere access to an address space for a single bank can implement accessing all banks and thus the testing period can be reduced.

Compression circuits 40-0 to 40-3 may be activated only in reading testing data and maintained inactivated otherwise, to reduce current consumption.

Modification of Compression Circuit

Figure 31:
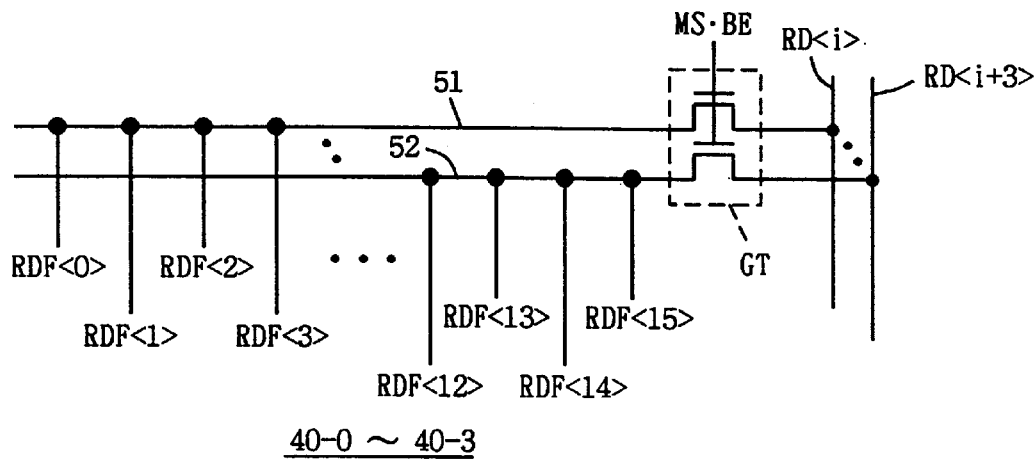
FIG. 31 shows another configuration of the degeneration circuit.

FIG. 31 shows a configuration of a modification of compression circuits 40-0 to 40-3 shown in FIG. 26. FIG. 31 shows the configuration for a single compression circuit. In FIG. 31, an internal signal line 51 wired-connects bank read data bus lines RDF<0>–RDF<3>, and a signal line 52 wired-connects internal read data bus lines RDF<12>–RDF<15>. The read data lines for the remaining eight bits are similarly wired-connected by four bits. Signal lines 51 and 52 are electrically connected to internal read data bus lines RD<i>–RD<i+3> via a compressed-data select gate GT which in turn conducts when a signal MS·BE (the AND of signals MS and BE) is activated.

For example, signal line 51 in the wired connection maintains a high level when bits RDF<0>–RDF<3> are all at a high level. The potential of signal line 51 falls to a low level when data of low level of at least one bit is mixed in bits RDF<0>–RDF<3>. Similarly, the potential of signal line 52 maintains a high level when the bits RDF<12>–RDF<15> are all at high level. Such a wired connection (wired AND connection) also allows 4-bit data to be compressed into 1-bit data.

Needless to say, signal lines 51 and 52 are precharged to high level before reading data. The configuration shown in FIG. 31 does not particularly require a gate circuit, such as an AND circuit, and the area occupied by the circuit can thus be reduced. The configuration with the wired connection shown in FIG. 31, is effective, if data read from a memory cell is at high level. In disturb testing in dynamic random access memories, however, a characteristic is measured that high-level data changes to low-level data due to leakage of electric charge and the like. Accordingly, there will not be any particular problem if such a wired connection is employed to write high-level data and determine whether the high-level data is read.

Modification of Read Circuit

Figure 32:
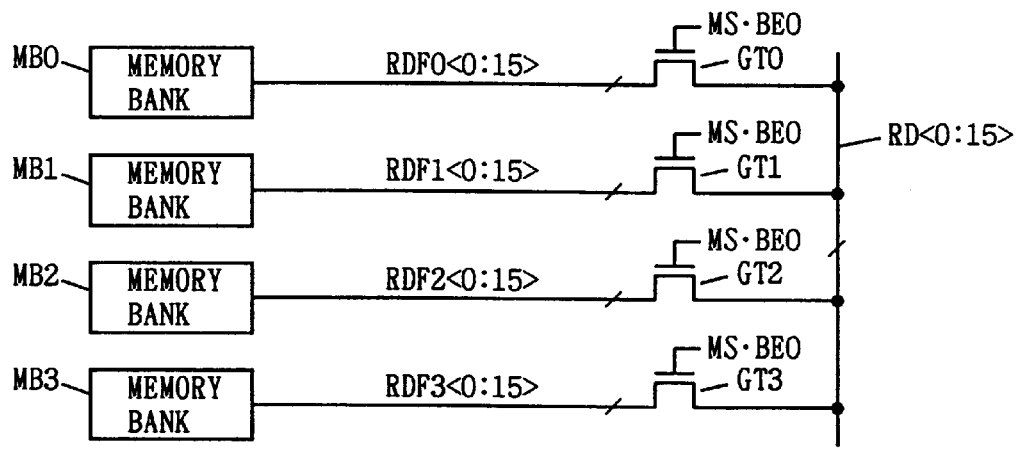
FIG. 32 schematically shows another configuration of the data reading portion of the semiconductor memory device shown in FIG. 26.

FIG. 32 shows another configuration of the testing data read unit of a semiconductor memory device as an implementation of the present invention. The configuration of the portion for normally writing/reading data is the same as that shown in FIG. 26, and bank select gates GS0–GS3 conduct to write/read data into/from memory cells of memory banks MB0–MB3.

In FIG. 32, bank read data buses RDF0<0:15>, RDF1<0:15>, RDF2<0:15> and RDF3<0:15> for the respective memory banks MB0–MB3 are connected via respective compressed-data select gates GT0–GT3 to read data bus RD<0:15>, with the bus lines of each of the former buses connected to the respective bus lines of the latter bus in a one-to-one correspondence.

Read data buses RDF0<0:15>–RDF3<0:15> are each wired-connected to read data bus RD<0:15>, respectively. Consequently, the configuration shown in FIG. 32 also allows data read from memory cells to be compressed and then output.

Figure 33:
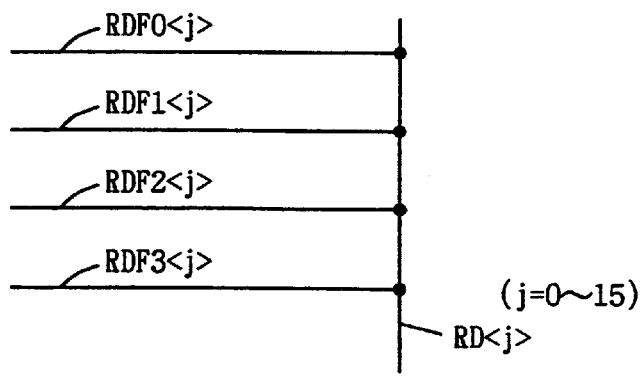
FIG. 33 schematically shows a specific configuration for the read data bus connection in FIG. 32.

FIG. 33 schematically shows a manner of connecting the bank read data buses to a 1-bit read data bus line RD<j> in the configuration shown in FIG. 32. FIG. 33 does not show the compressed-data select gates, since they are in conducting state in the test operation. In FIG. 33, read data bus lines RDF0<j>, RDF1<j>, RDF2<j> and RDF3<j> from the respective memory banks MB0–MB3 are wired-connected to read data bus line RD<j>, wherein j represents any of 0 to 15. Data read from a memory cell in each bank is wired-connected to a common data bus line and 4-bit data is also compressed into 1-bit data. The wired connection shown in FIG. 33 is substantially a wired AND connection, since the data on common read data bus line RD<j> attains a high level when the data on bus lines RDF<j>–RDF3<j> are at high level, and otherwise attains a low level.

The use of wired connection as a compression circuit in this reading path dispenses with a dedicated logic gate and can thus reduce the area occupied by the circuit.

Another Application

In the above description, all banks are simultaneously operated in the test mode to select memory cells. Hereinafter, an operation mode in a normal mode used by users will now be described.

Figure 34:
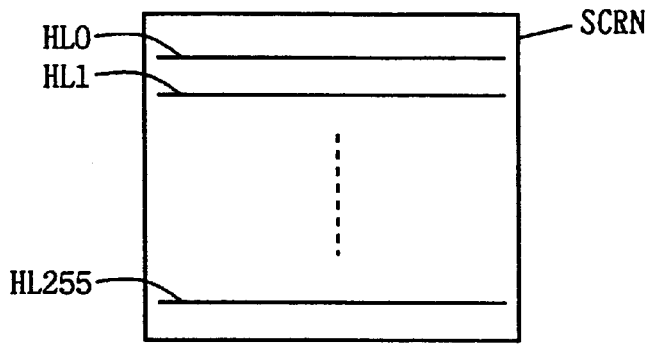
FIG. 34 shows a screen configuration for illustrating another application of the present invention.

FIG. 34 shows a display screen SCRN including 256 scanning lines HL0–HL255, as generally known in the field of image processing. Display screen SCRN corresponds to one field in image processing. Display screen SCRN correspond to one field of a frame formed of even- and odd fields.

Figure 35:
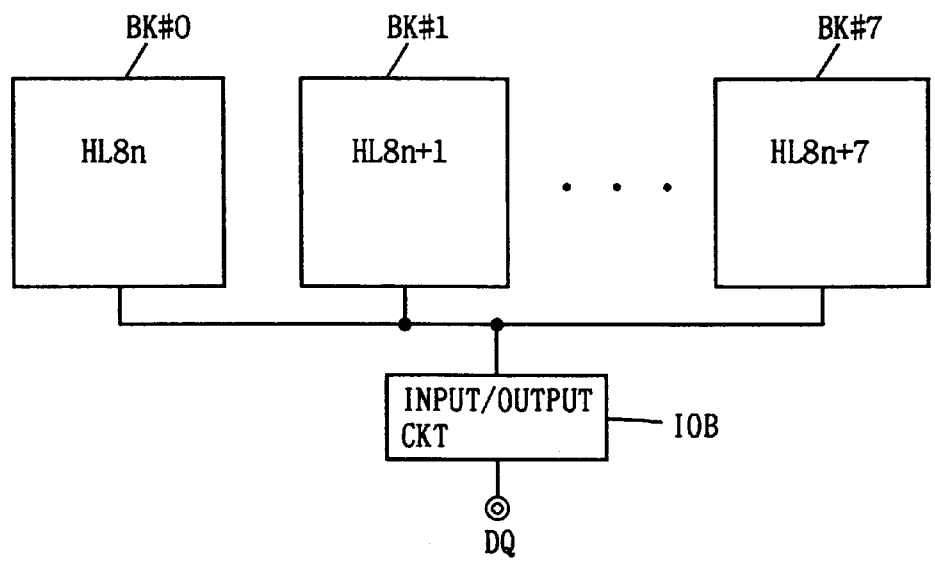
FIG. 35 schematically shows a bank configuration of a memory for another application of the present invention.

As shown in FIG. 35, a semiconductor memory device includes eight banks BK#0–BK#7 each for storing pixel data on every eighth scanning line. More specifically, the pixel data on scanning lines HL8n (n=0, 1, . . . ), HL8n+1, . . . , and HL8n+7 are stored in banks BK#0, BK#1, . . . , and BK#7, respectively. Banks BK#0–BK#7 are commonly connected to an input/output circuit IOB.

In the normal mode of operation, banks BK#0–BK#7 are activated in an interleaving manner and pixel data on scanning lines HLB0–HL255 are successively input/output so that the overhead in switching pages (in changing scanning lines) is reduced.

Figure 36:
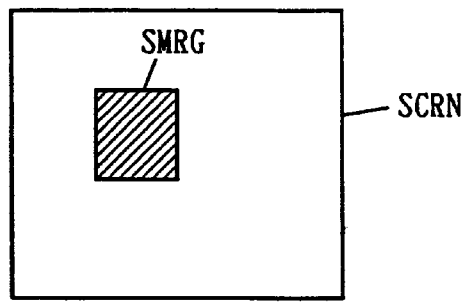
FIG. 36 is a diagram for explaining a content processed by the semiconductor memory device shown in FIG. 35.
Figure 37:
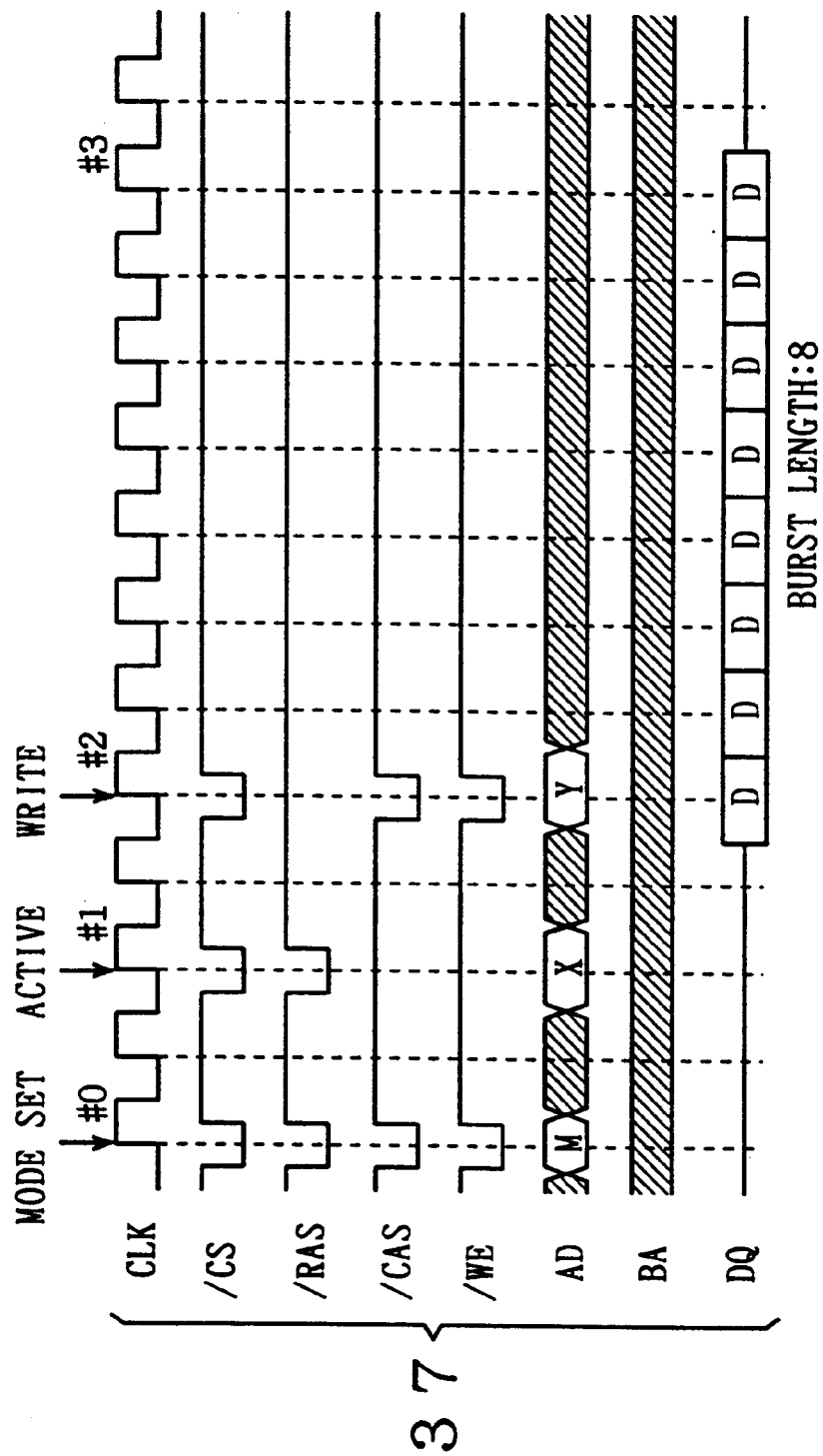
FIG. 37 is a timing chart for representing an operation sequence in executing the processing shown in FIG. 36.

Now, consider the "color-in" processing for displaying a predetermined small region SMRG on screen SCRN as a region of a same color, as shown in FIG. 36. To simplify the description, small region SMRG is formed of pixels in eight rows by eight columns. Small region SMRG is colored in according to the sequence shown in FIG. 37.

Initially, a mode setting command is applied in clock cycle #0 to provide an instruction that all banks are simultaneously activated, and a burst length of eight is also set (when the initial value of the burst length is not eight). Then, an active command is applied in clock cycle #1 and banks BK#0–BK#7 have each row in small region SMRG driven to a selected state. Thus, the scanning lines included in small region SMRG are simultaneously driven to selected state in each bank, provided that the small region is formed of eight rows, i.e., eight scanning lines.

Then, a write command and data D indicating a color for coloring-in are applied in clock cycle #2. With the address signal AD when the write command is applied as a column address signal Y, a memory cell select operation is performed. The current write data D is taken and written into a selected memory cell. Burst addresses are successively generated internally and externally applied data D is successively taken and written into selected memory cells in a predetermined sequence. Thus, when writing of the successive data is completed at clock cycle #3, each of banks BK#0–BK#7 has data written in one row by eight columns of memory cells and thus the pixel data in eight row by eight columns are completely written. Since the burst length of eight has been set, small region SMRG is completely colored in by a single write command only and rapid processing can be achieved. When the color-in processing is completed, an all-bank precharge command is applied to drive all the banks to inactive state and a mode resetting command is then applied to inactivate mode-setting indicating signal MS and activate/inactivate banks BK#0–BK#7 again in the interleaving manner.

Thus, all banks can also be simultaneously activated in normal writing/reading of data depending on the content of a specific processing, such as an application for image processing, as shown in FIGS. 34–37, to significantly reduce the processing time.

Figure 38:
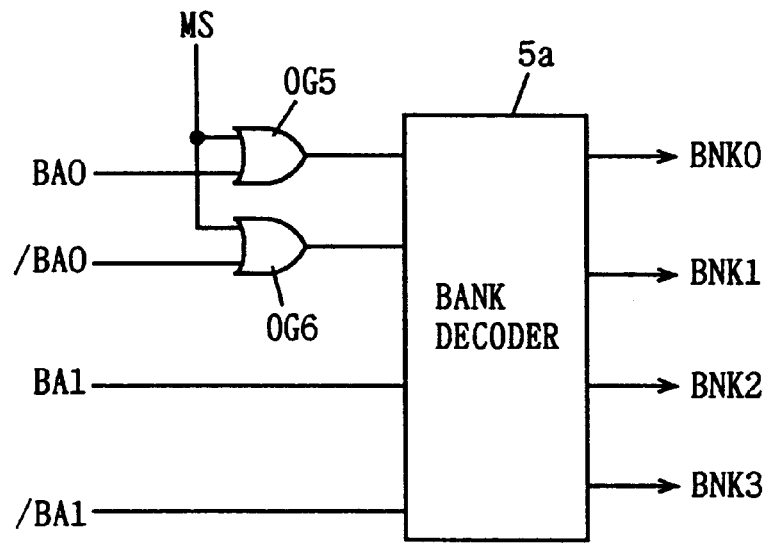
FIG. 38 schematically shows a configuration of a bank select signal generating portion as still another embodiment of the present invention.
Figure 41:
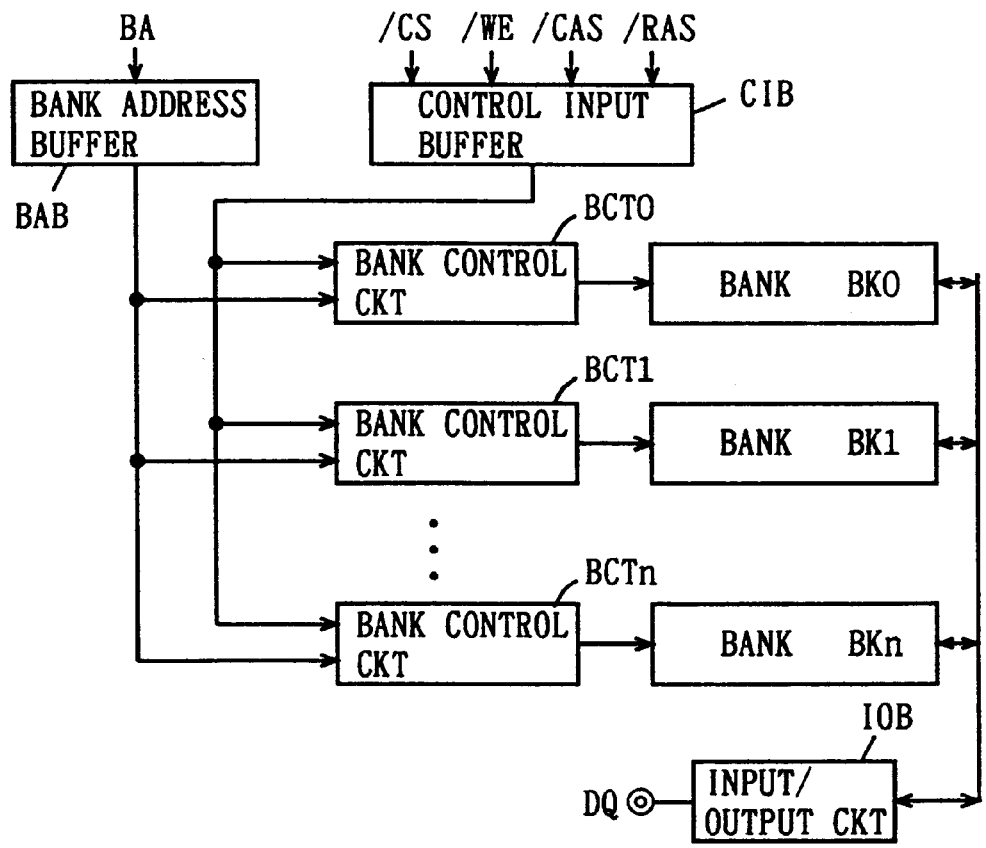
FIG. 41 schematically shows the entire configuration of a conventional synchronous semiconductor memory device.
Figure 39:
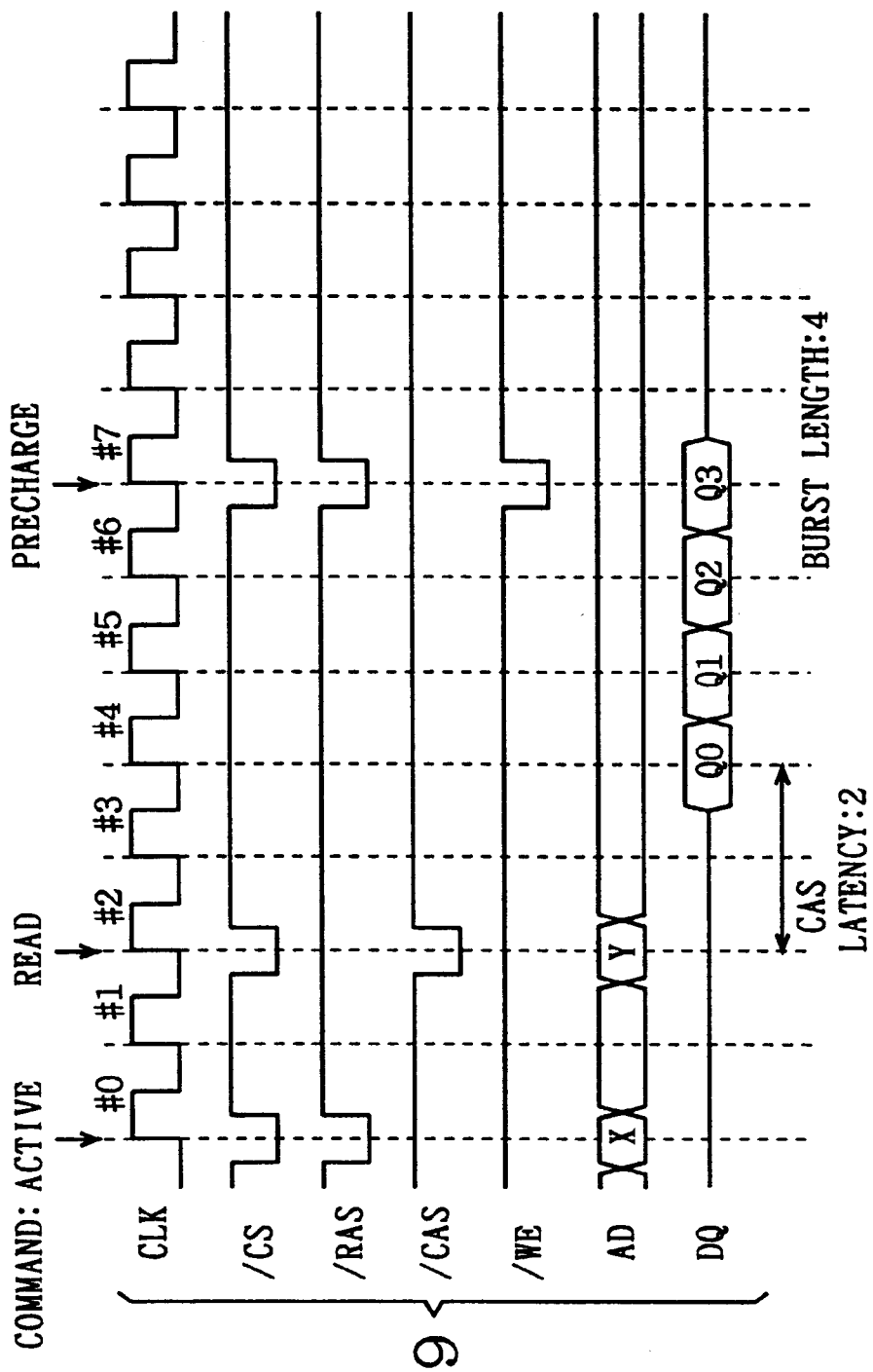
FIG. 39 is a timing chart for representing an operation in reading data in a conventional synchronous semiconductor memory device.
Figure 4:
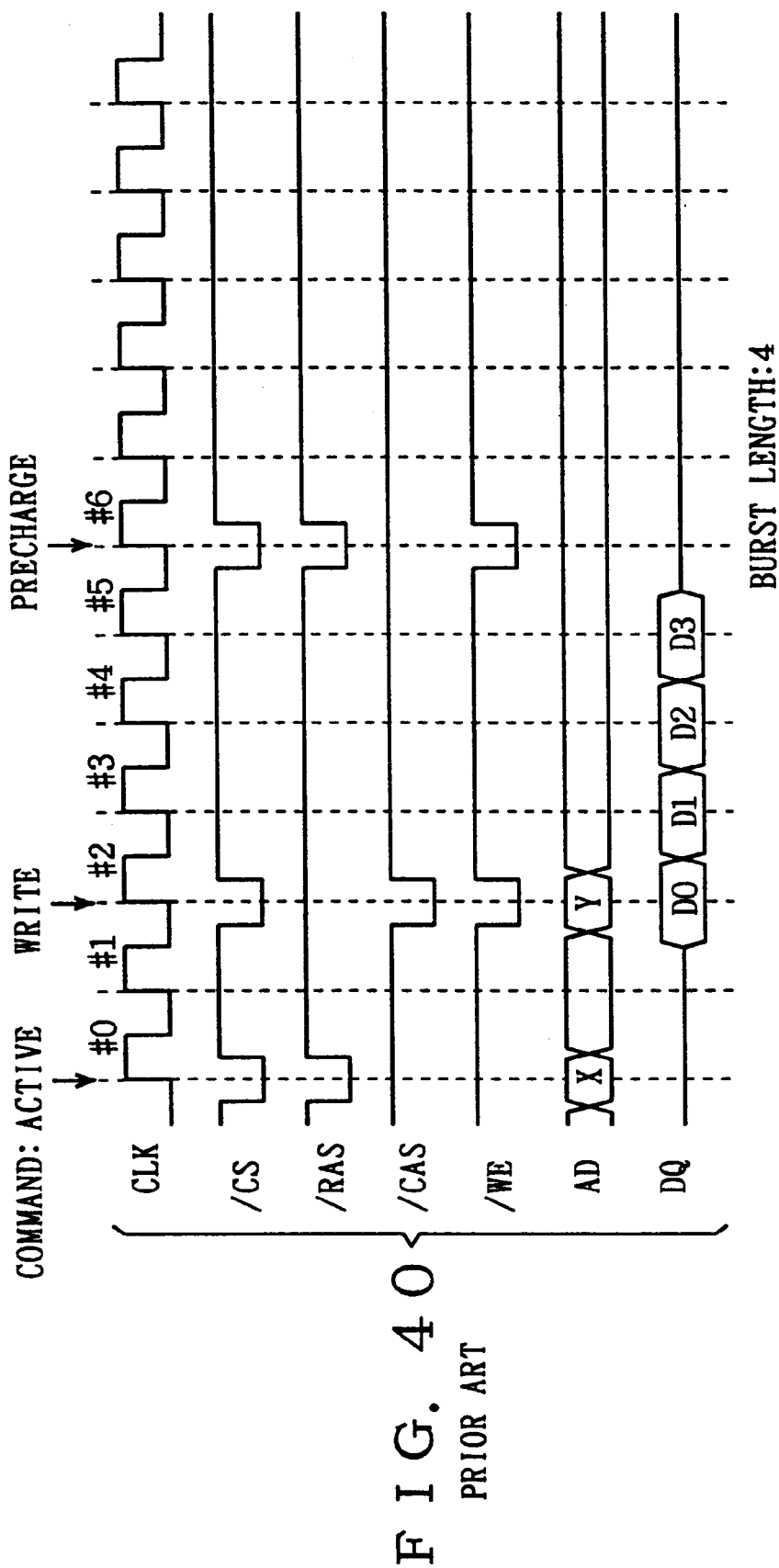
Figure 43:
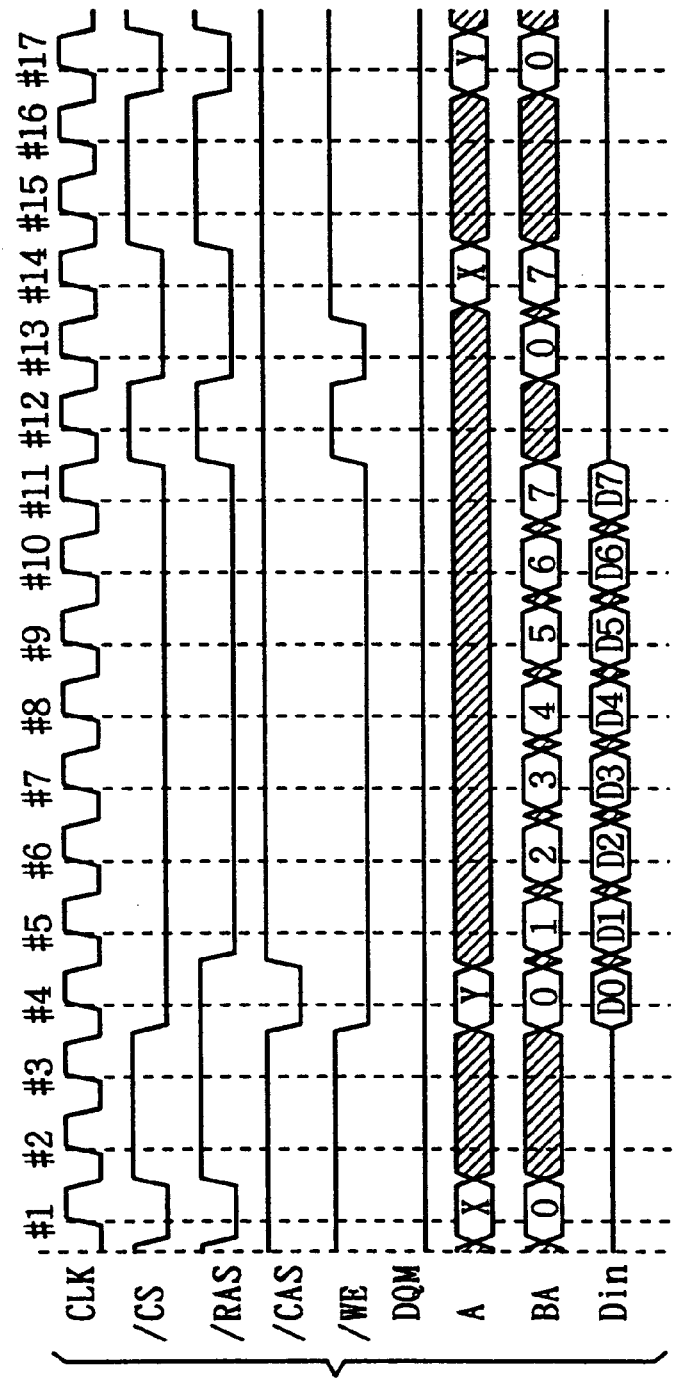
FIG. 43 is a timing chart for representing an operation in writing data in the synchronous semiconductor memory device shown in FIG. 41.
Figure 4:
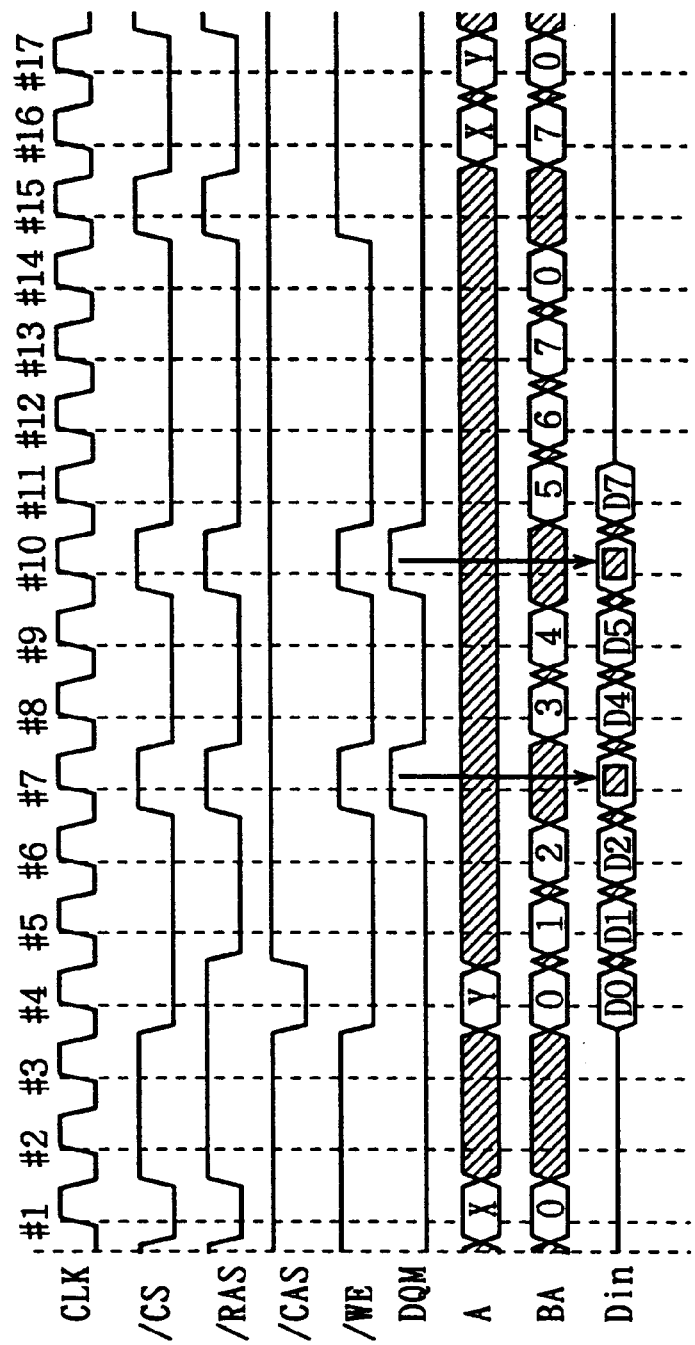
Figure 45:
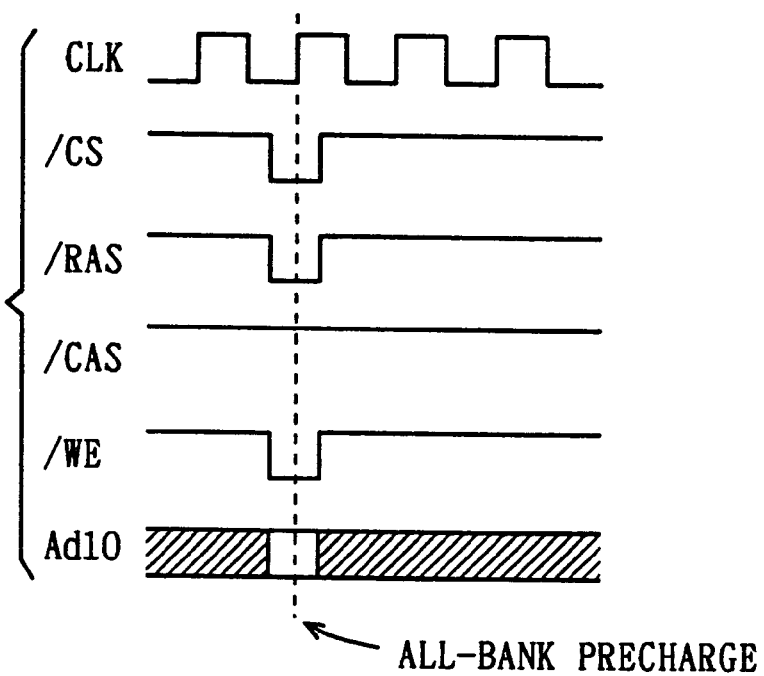
FIG. 45 represents the all-bank precharge command of a conventional synchronous semiconductor memory device.

FIG. 38 shows a configuration of a main portion of a synchronous semiconductor memory device as still another embodiment of the present invention. FIG. 38 shows a configuration of bank decoder circuitry which outputs bank select signals BNK0–BNK3. FIG. 38 shows an OR circuit OG5 for receiving bank address signal bit BA0 and mode-setting indicating signal MS, and an OR circuit OG6 for receiving complementary bank address signal bit /BA0 and mode-setting indicating signal MS. The configuration of bank decoder 5a is the same as that shown in FIG. 7. When mode-setting indicating signal MS is activated in the configuration shown in FIG. 38, bank address signal bits BA0 and /BA0 both attain high level and accordingly bank decoder 5a drives two of four bank select signals BNK0–BNK3 to active state. In this case also, the number of simultaneously activated banks is two, i.e., different from that of simultaneously activated banks normally, the number of banks simultaneously activated is increased in testing, and the testing time can be reduced.

Second Application

While the above description has been provided with respect to synchronous dynamic random access memories, the present invention is applicable to a memory with a bank configuration, wherein a mode of operation is designated by a command applied in synchronization with a clock signal and data is input/output in synchronization with a clock signal (e.g., synchronous static random access memory).

The present invention is also applicable to a memory in which external signals are taken and data is input/output at rising and falling edges of a clock signal.

Since the present invention allows a plurality of banks to be simultaneously activated/inactivated in a specific mode of operation, as described above, a mere access to an address space allocated to a single bank can achieve accessing address spaces of a plurality of banks and fast processing can thus be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said memory cell selection instruction instructs reading data from a selected memory cell, and wherein said semiconductor memory device further comprises:

compression means responsive to said operation mode designation signal and to said memory cell selection instruction, for compressing data read from memory cells selected in said predetermined number of banks by said plurality of memory cell select means for output, wherein said compression means includes means for compressing the data on a bank by bank basis for outputting in parallel.

2. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one wherein said memory cell selection instruction instructs selecting of a row of memory cells; and wherein said control means includes means responsive to said operation mode designation signal, said memory cell selection instruction and a special operation mode instruction for controlling said plurality of memory cell select means to simultaneously select a plurality of rows in each of said predetermined number of banks.

3. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include:

(i) a plurality of array blocks each having a plurality of memory cells arranged in a matrix of rows and columns;

(ii) a plurality of local data lines provided corresponding to said plurality of array blocks, for transmitting data with corresponding array blocks; and (iii) a global data line commonly provided for said plurality of array blocks, and selectively, electrically connected to said plurality of local data lines; and wherein said semiconductor memory device further includes means responsive to said operation mode designating signal for dividing each of said plurality of local data lines into a plurality of sub data lines.

4. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include:

(i) a plurality of array blocks each having a plurality of memory cells arranged in a matrix of rows and columns;

(ii) a plurality of local data lines provided corresponding to said plurality of array blocks, for transmitting data with corresponding array blocks; and (iii) a global data line commonly provided for said plurality of array blocks, and selectively, electrically connected to said plurality of local data lines; and wherein said semiconductor memory device further includes means responsive to said operation mode designating signal for dividing each of said plurality of local data lines into a plurality of sub data lines, wherein:

said memory cell selection instruction instructs selecting a column in said plurality of array blocks;

each said memory cell select means includes column select means for selecting a column corresponding to an applied address; and said control means includes means responsive to said operation mode designating signal for causing said column select means to select a column correspondingly to each of said subdata lines.

5. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated;

control means responsive to an operation mode designation signal and to a memory cell selection instruction instructing a memory cell selection, for simultaneously activating memory cell select means provided for a predetermined number of banks out of said plurality of memory cell select means, said predetermined number being greater than one; and a common data line commonly provided for said plurality of banks, wherein said control means further includes means responsive to said operation mode designating signal for disconnecting said plurality of banks from said common data line.

6. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include:

(i) a plurality of array blocks each having a plurality of memory cells arranged in a matrix of rows and columns;

(ii) a plurality of local data lines provided corresponding to said plurality of array blocks, for transmitting data with corresponding array blocks; and (iii) a global data line commonly provided for said plurality of array blocks, and selectively, electrically connected to said plurality of local data lines; and wherein said semiconductor memory device further includes means responsive to said operation mode designating signal for dividing each of said plurality of local data lines into a plurality of sub data lines; the semiconductor memory device further comprising:

a plurality of preamplifier means provided for the global data lines of said plurality of banks for amplifying data on the global data lines; and a plurality of internal read data lines provided commonly for said plurality of banks, for transmitting data output from a selected preamplifier means; wherein said control means includes means responsive to said operation mode designating signal for disconnecting said plurality of preamplifier means from the internal read data lines.

7. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said memory cell selection instruction instructs reading data from a selected memory cell, and wherein said semiconductor memory device further comprises:

compression means responsive to said operation mode designation signal and to said memory cell selection instruction, for compressing data read from memory cells selected in said predetermined number of banks by said plurality of memory cell select means for output, wherein:

each of the memory cell select means includes means for simultaneously reading data from a plurality of memory cells in a corresponding bank;

said compression means includes a plurality of compression circuits provided for the respective banks, for compressing data read from the plurality of memory cells in the respective banks, to output the compressed data in parallel to different pin terminals.

8. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said memory cell selection instruction instructs reading data from a selected memory cell, and wherein said semiconductor memory device further comprises:

compression means responsive to said operation mode designation signal and to said memory cell selection instruction, for compressing data read from memory cells selected in said predetermined number of banks by said plurality of memory cell select means for output, wherein:

said compression means includes a plurality of internal data lines provided corresponding to said plurality of banks, and a data line wired-coupled with said plurality of internal data lines for transmitting compressed data.

9. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include:

(i) a plurality of array blocks each having a plurality of memory cells arranged in a matrix of rows and columns;

(ii) a plurality of local data lines provided corresponding to said plurality of array blocks, for transmitting data with corresponding array blocks; and (iii) a global data line commonly provided for said plurality of array blocks, and selectively, electrically connected to said plurality of local data lines; and wherein said semiconductor memory device further includes means responsive to said operation mode designating signal for dividing each of said plurality of local data lines into a plurality of sub data lines, wherein said control means includes means responsive to said operation mode designation signal for disconnecting said plurality of local data lines from said global data line.

10. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include (i) a plurality of array blocks each having a plurality of memory cells arranged in a matrix of rows and columns, (ii) a plurality of local data lines provided corresponding to the respective array blocks, for transmitting data with corresponding array blocks, and (iii) a global data line commonly provided for said plurality of array blocks, and selectively, electrically connected to said plurality of local data lines; and wherein said control means further includes means responsive to said operation mode designation signal for disconnecting said plurality of local data lines from said global data line.

11. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said plurality of banks each include:
  (i) a plurality of array blocks each having a plurality of memory cells arranged in a matrix of rows and columns;
  (ii) a plurality of local data lines provided corresponding to said plurality of array blocks, for transmitting data with corresponding array blocks; and
  (iii) a global data line commonly provided for said plurality of array blocks, and selectively, electrically connected to said plurality of local data lines; and wherein said semiconductor memory device further includes means responsive to said operation mode designating signal for dividing each of said plurality of local data lines into a plurality of sub data lines, wherein said control means includes means responsive to said operation mode designation signal for controlling the memory cell select means to simultaneously select a plurality of rows in each of said plurality of banks.

12. A semiconductor memory device having a plurality of banks capable of being driven to active and inactive states independently from each other, the banks each including memory cells in rows and columns, comprising:

a plurality of memory cell select means provided corresponding to said plurality of banks, each for performing an operation of selecting a memory cell in a corresponding bank when activated; and control means responsive to an operation mode designation signal and to a memory cell selection instruction instructing a memory cell selection, for simultaneously activating memory cell select means provided for a predetermined number of banks out of said plurality of memory cell select means, said predetermined number being greater than one, wherein said memory cell selection instruction instructs selecting a plurality of memory cells in each of the predetermined number of banks, and wherein said semiconductor memory device further includes a plurality of internal data lines provided corresponding to each respective bank, for transmitting data read from the selected memory cells in corresponding banks, a plurality of common data lines provided in common to said plurality of banks, and gate means provided for each of said plurality of internal data lines and responsive to said operation mode designation signal for connecting each of said plurality of internal data lines for the predetermined number of banks in parallel to each respective common data line.

* * * * *